US012635265B2

(12) United States Patent
Shimizu et al.

(10) Patent No.: US 12,635,265 B2
(45) Date of Patent: May 19, 2026

(54) LIGHT DETECTOR, LIGHT DETECTION SYSTEM, LIDAR DEVICE, AND MOBILE BODY

(71) Applicant: Kabushiki Kaisha Toshiba, Tokyo (JP)

(72) Inventors: Mariko Shimizu, Setagaya Tokyo (JP); Kazuhiro Suzuki, Meguro Tokyo (JP); Ikuo Fujiwara, Yokohama Kanagawa (JP); Ryoma Kaneko, Ota Tokyo (JP); Keita Sasaki, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 539 days.

(21) Appl. No.: 18/174,597

(22) Filed: Feb. 24, 2023

(65) Prior Publication Data

US 2024/0072191 A1 Feb. 29, 2024

(30) Foreign Application Priority Data

Aug. 26, 2022 (JP) ................................. 2022-134853

(51) Int. Cl.
*H10F 30/225* (2025.01)
*H10F 77/40* (2025.01)
(Continued)

(52) U.S. Cl.
CPC ......... *H10F 30/225* (2025.01); *H10F 77/413* (2025.01); *G01S 7/4865* (2013.01); *G01S 17/931* (2020.01); *H10F 30/223* (2025.01)

(58) Field of Classification Search
CPC ................. H10F 30/225; H10F 30/223; H10F 30/2255; H10F 77/413; H10F 39/184;
(Continued)

(56) References Cited

U.S. PATENT DOCUMENTS

2004/0245592 A1 12/2004 Harmon et al.
2010/0271108 A1* 10/2010 Sanfilippo ............. H10F 77/241
257/438

(Continued)

FOREIGN PATENT DOCUMENTS

JP 2019114728 A 7/2019
JP 2020009790 A 1/2020
(Continued)

*Primary Examiner* — Sitaramarao S Yechuri
(74) *Attorney, Agent, or Firm* — Kim & Stewart LLP

(57) ABSTRACT

A light detector includes a semiconductor layer and a light-receiving element. The semiconductor layer is of a first conductivity type. The light-receiving element includes a first semiconductor region, a second semiconductor region, a third semiconductor region, and a fourth semiconductor region. The first semiconductor region is of a second conductivity type. The second semiconductor region is located between the first semiconductor region and the semiconductor layer. The second semiconductor region is of the first conductivity type and contacts the first semiconductor region. The third semiconductor region is located between the second semiconductor region and the semiconductor layer. The third semiconductor region is of the second conductivity type. The fourth semiconductor region is located between the third semiconductor region and the semiconductor layer. The fourth semiconductor region is of the first conductivity type, and has a lower first-conductivity-type impurity concentration than a first-conductivity-type impurity concentration of the semiconductor layer.

20 Claims, 14 Drawing Sheets

(51) Int. Cl.
  *G01S 7/4865* (2020.01)
  *G01S 17/931* (2020.01)
  *H10F 30/223* (2025.01)

(58) Field of Classification Search
  CPC .... H10F 39/80; H10F 39/8057; H10F 39/806;
  H10F 39/811; G01S 7/4865; G01S
  17/931
  See application file for complete search history.

(56)                References Cited

U.S. PATENT DOCUMENTS

| | | | |
|---|---|---|---|
| 2019/0237609 A1 | 8/2019 | Onal et al. | |
| 2019/0280145 A1 | 9/2019 | Natsuaki et al. | |
| 2020/0052144 A1 | 2/2020 | Onal et al. | |
| 2020/0105958 A1 | 4/2020 | Sasago et al. | |
| 2021/0132230 A1 | 5/2021 | Fujiwara et al. | |
| 2021/0183930 A1 | 6/2021 | Takatsuka | |
| 2021/0210647 A1 | 7/2021 | Onal et al. | |
| 2021/0280734 A1 | 9/2021 | Iacobucci et al. | |
| 2021/0396780 A1 | 12/2021 | Masunishi et al. | |
| 2023/0145695 A1* | 5/2023 | Nishino | G01S 7/4861 |
| | | | 250/206 |

FOREIGN PATENT DOCUMENTS

| | | | |
|---|---|---|---|
| JP | 2020057651 A | 4/2020 | |
| JP | 2021072347 A | 5/2021 | |
| JP | 2022001828 A | 1/2022 | |
| JP | 2023015075 A | 1/2023 | |

* cited by examiner

LIGHT DETECTOR, LIGHT DETECTION SYSTEM, LIDAR DEVICE, AND MOBILE BODY

CROSS-REFERENCE TO RELATED APPLICATIONS

This application is based upon and claims the benefit of priority from Japanese Patent Application No. 2022-134853, filed on Aug. 26, 2022; the entire contents of which are incorporated herein by reference.

FIELD

Embodiments relate to a light detector, a light detection system, a lidar device, and a mobile body.

BACKGROUND

There is a light detector that detects light incident on a semiconductor region. It is desirable to improve the responsivity of the light detector.

DETAILED DESCRIPTION

Figure 1:
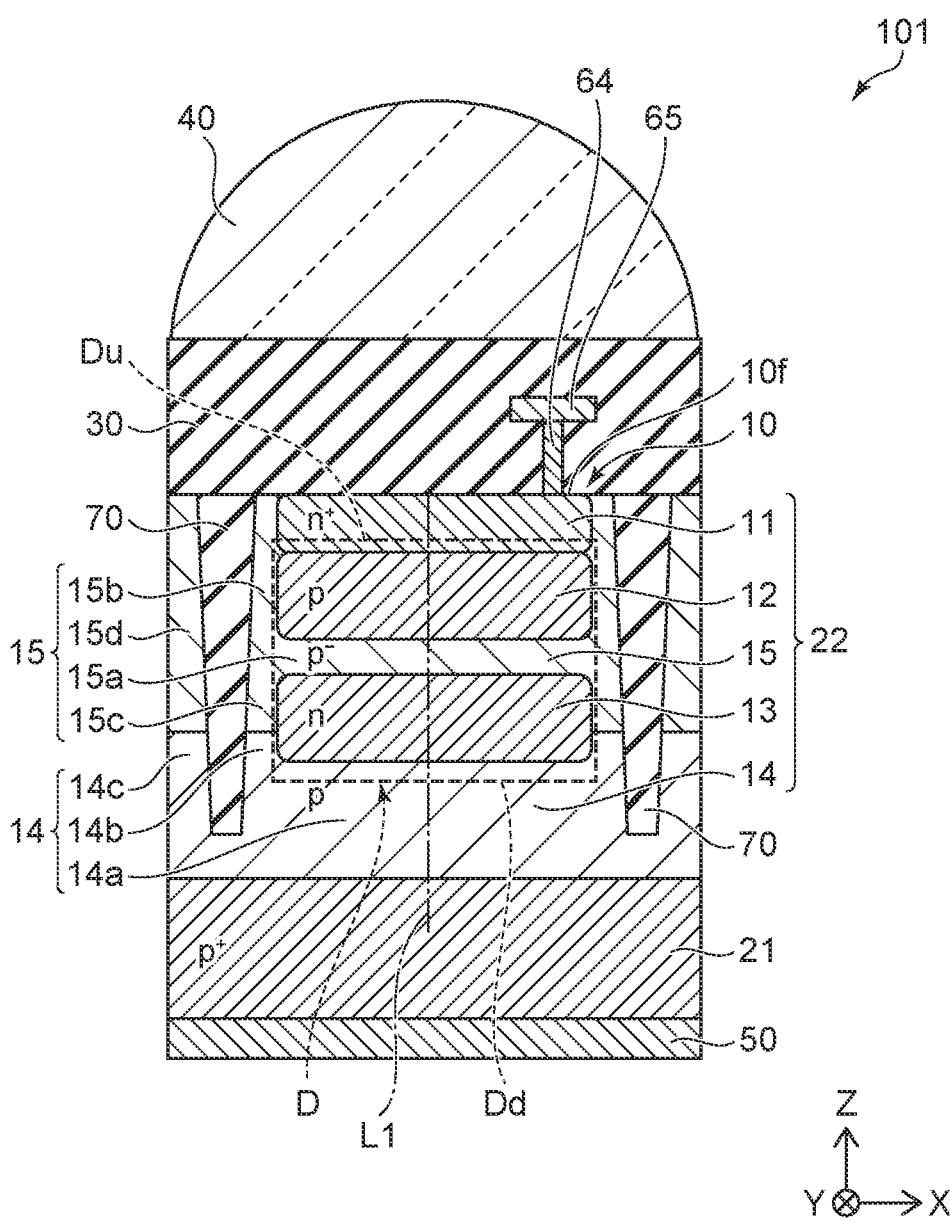
FIG. 1 is a schematic cross-sectional view illustrating a light detector according to an embodiment.

A light detector according to one embodiment, includes a semiconductor layer and a light-receiving element. The semiconductor layer is of a first conductivity type. The light-receiving element includes a first semiconductor region, a second semiconductor region, a third semiconductor region, and a fourth semiconductor region. The first semiconductor region is of a second conductivity type. The second semiconductor region is located between the first semiconductor region and the semiconductor layer. The second semiconductor region is of the first conductivity type and contacts the first semiconductor region. The third semiconductor region is located between the second semiconductor region and the semiconductor layer. The third semiconductor region is of the second conductivity type. The fourth semiconductor region is located between the third semiconductor region and the semiconductor layer. The fourth semiconductor region is of the first conductivity type. The fourth semiconductor region has a lower first-conductivity-type impurity concentration than a first-conductivity-type impurity concentration of the semiconductor layer.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

According to embodiments, a first conductivity type is one of a p-type or an n-type. A second conductivity type is the other of the p-type or the n-type. In the following description, the first conductivity type is the p-type, and the second conductivity type is the n-type.

FIG. 1 is a schematic cross-sectional view illustrating a light detector according to an embodiment.

As illustrated in FIG. 1, the light detector 101 according to the embodiment includes a light-receiving element 10 (an element region) and a semiconductor layer 21 (a first semiconductor layer). In the example, the light detector 101 further includes an insulating layer 30, a light concentrator 40, an electrode 50, and a structure part 70. The light-receiving element 10 is located on the semiconductor layer 21.

In the description of the embodiments, the direction from the semiconductor layer 21 toward the light-receiving element 10 is taken as a Z-axis direction (a first direction). A direction perpendicular to the Z-axis direction is taken as an X-axis direction (a second direction). The X-axis direction is parallel to the front surface of a semiconductor layer 22. A direction perpendicular to the Z-axis direction and the X-axis direction is taken as a Y-axis direction (a third direction). In the description, the direction from the semiconductor layer 21 toward the light-receiving element 10 is called "up", and the opposite direction is called "down". These directions are based on the relative positional relationship between the semiconductor layer 21 and the light-receiving element 10 and are independent of the direction of gravity. "Up" corresponds to the side at which the light concentrator 40 is mounted and at which light is incident on the light detector.

The electrode 50 is, for example, a back electrode. The semiconductor layer 21 is located on the electrode 50 and is electrically connected with the electrode 50. The semiconductor layer 21 is, for example, a semiconductor substrate of the first conductivity type. A semiconductor region 14 is located on the semiconductor layer 21. The semiconductor region 14 is, for example, a portion of an epitaxial layer of the first conductivity type. The semiconductor region 15 is located on the semiconductor region 14. The semiconductor region 15 is, for example, a portion of an epitaxial layer of the first conductivity type.

The light-receiving element 10 includes a first semiconductor region 11, a second semiconductor region 12, a third semiconductor region 13, and the fourth semiconductor region 14. The first semiconductor region 11 is of the second conductivity type. The first semiconductor region 11 is electrically connected with a first wiring part 51 described below via a contact 64 and an interconnect 65. The first wiring part 51 is electrically connected with a pad 55 described below. The pad 55 is electrically connected with an external electronic device via a bonding wire, etc.

The second semiconductor region 12 is located between the first semiconductor region 11 and the semiconductor layer 21. The second semiconductor region 12 is of the first conductivity type. The second semiconductor region 12 contacts the first semiconductor region 11.

The third semiconductor region 13 is located between the second semiconductor region 12 and the semiconductor layer 21. The third semiconductor region 13 is of the second conductivity type.

At least a portion of the fourth semiconductor region 14 is located between the third semiconductor region 13 and the semiconductor layer 21. The fourth semiconductor region 14 is of the first conductivity type. The fourth semiconductor region 14 contacts the semiconductor layer 21. In the example, the fourth semiconductor region 14 contacts the third semiconductor region 13. The fourth semiconductor region 14 may not contact the third semiconductor region 13.

In the example, the light-receiving element 10 further includes the fifth semiconductor region 15. At least a portion of the fifth semiconductor region 15 is located between the second semiconductor region 12 and the third semiconductor region 13. The fifth semiconductor region 15 is of the first conductivity type. The fifth semiconductor region 15 contacts the second and third semiconductor regions 12 and 13. The fifth semiconductor region 15 is electrically connected with the second and third semiconductor regions 12 and 13.

The first semiconductor region 11 of the second conductivity type is electrically connected with the pad 55 described below via the first wiring part 51 described below. The third semiconductor region 13 of the second conductivity type and the semiconductor regions 12, 14, and 15 of the first conductivity type are electrically connected with the electrode 50 via the semiconductor layer 21.

The first to fifth semiconductor regions 11 to 15 are, for example, regions located in one semiconductor layer 22 (a second semiconductor layer). The semiconductor layer 22 is located on the semiconductor layer 21 (e.g., a substrate). The semiconductor layer 22 contacts the semiconductor layer 21 and is electrically connected with the semiconductor layer 21. For example, the light-receiving element 10 (the first semiconductor region 11, the second semiconductor region 12, and the third semiconductor region 13) is located inside the semiconductor layer 22 in which the fourth semiconductor region 14 and the fifth semiconductor region 15 are located.

A photodiode (a pixel) is formed of the first and second semiconductor regions 11 and 12 (and portions of the third to fifth semiconductor regions 13 to 15). The photodiode (the light-receiving element 10) includes a light-receiving surface 10f. The light-receiving surface 10f is the upper surface of the first semiconductor region 11.

The structure part 70 is arranged with the light-receiving element 10 in a direction crossing the Z-axis direction. The structure part 70 is, for example, a structure body located inside a trench provided in the semiconductor layer 22. The structure part 70 surrounds the light-receiving element 10. The planar shape (the shape in the X-Y plane perpendicular to the Z-axis direction) of the structure part 70 is, for example, ring-shaped.

The structure part 70 includes a different material from the regions (the first to fifth semiconductor regions 11 to 15) of the semiconductor layer 22. The refractive index of the structure part 70 is different from the refractive indexes of the regions of the semiconductor layer 22. The refractive index of the structure part 70 is different from the refractive index of the light-receiving element 10. The structure part 70 is insulative. At least a portion of the trench interior (the structure part 70) may be hollow.

For example, the depth of the structure part 70 (the trench) is deeper than the third semiconductor region 13. In other words, the position in the Z-axis direction of the lower end of the structure part 70 is between the position in the Z-axis direction of the lower end of the third semiconductor region 13 and the position in the Z-axis direction of the semiconductor layer 21 (or the electrode 50). The ring-shaped structure part 70 surrounds the third semiconductor region 13. The length along the Z-axis direction of the structure part 70 (the depth of the trench) is, for example, not less than 5 μm and not more than 10 μm. The thickness of the semiconductor layer 22 is, for example, not less than 3 μm and not more than 30 μm.

In the example of FIG. 1, the fourth semiconductor region 14 includes a portion 14a, a portion 14b, and a portion 14c. The portion 14a is located between the third semiconductor region 13 and the semiconductor layer 21 in the Z-axis direction.

The portion 14b is located between the third semiconductor region 13 and the structure part 70 in the X-axis direction (and directions in the X-Y plane). The portion 14b contacts the structure part 70 and the third semiconductor region 13. For example, the portion 14b surrounds the third semiconductor region 13 at the inner side of the ring-shaped structure part 70. The portion 14b may be omitted. In other words, the third semiconductor region 13 may contact the structure part 70.

The portion 14c is located at the outer side of the structure part 70 and contacts the structure part 70. The portion 14c surrounds the structure part 70. In other words, the structure part 70 is located between the portion 14c and the portion 14b and between the portion 14c and the portion 14a.

For example, the lower end of the structure part 70 contacts the fourth semiconductor region 14. The portion 14a at the inner side of the structure part 70 is continuous with the portion 14c at the outer side of the structure part 70 via the portion of the semiconductor layer 22 below the structure part 70.

In the example of FIG. 1, the fifth semiconductor region 15 includes a portion 15a, a portion 15b, a portion 15c, and a portion 15d. The portion 15a is located between the second semiconductor region 12 and the third semiconductor region 13.

The portion 15b is located between the first semiconductor region 11 and the structure part 70 and between the second semiconductor region 12 and the structure part 70. The portion 15b contacts the first semiconductor region 11, the second semiconductor region 12, and the structure part 70. For example, the portion 15b surrounds the first semiconductor region 11 and the second semiconductor region 12 at the inner side of the ring-shaped structure part 70.

The portion 15c is located between the third semiconductor region 13 and the structure part 70. The portion 15c contacts the third semiconductor region 13 and the structure part 70. For example, the portion 15c surrounds the third semiconductor region 13 at the inner side of the ring-shaped structure part 70.

The portion 15d is located at the outer side of the structure part 70 and contacts the structure part 70. The portion 15d surrounds the structure part 70. In other words, the structure part 70 is located between the portion 15d and the portion 15b and between the portion 15d and the portion 15c. The portion 15d at the outer side of the structure part 70 may be partitioned from the portions 15a, 15b, and 15c at the inner side of the structure part 70 and separated from the portions 15a, 15b, and 15c at the inner side of the structure part 70 by the structure part 70.

The portion 15b and the portion 15c may be omitted. In other words, the first semiconductor region 11, the second semiconductor region 12, and the third semiconductor region 13 may contact the structure part 70.

In the example, the fifth semiconductor region 15 contacts the fourth semiconductor region 14. Specifically, the portion 14b contacts the portion 15c; and the portion 14c contacts the portion 15d.

For example, the planar shape of the third semiconductor region 13 may be wider than the planar shape of the first semiconductor region 11 and may be wider than the planar shape of the second semiconductor region 12. For example, the length along the X-axis direction of the third semiconductor region 13 may be greater than the length along the X-axis direction of the first semiconductor region 11 and may be greater than the length along the X-axis direction of the second semiconductor region 12.

However, the planar shapes are not limited thereto; the planar shape of the third semiconductor region 13 may be narrower than the planar shape of the first semiconductor region 11 and narrower than the planar shape of the second semiconductor region 12. For example, the length along the X-axis direction of the third semiconductor region 13 may be equal to or less than the length along the X-axis direction of the first semiconductor region 11 and may be equal to or less than the length along the X-axis direction of the second semiconductor region 12.

For example, the third semiconductor region 13 is located at the center of the light-receiving element 10 in the X-Y plane. For example, in the X-Y plane, the center position of the third semiconductor region 13 may match at least one of the center position of the first semiconductor region 11, the center position of the second semiconductor region 12, or the center position of the ring-shaped structure part 70.

The insulating layer 30 is located on the semiconductor layer 22 and contacts, for example, the upper surface of the semiconductor layer 22. The light concentrator 40 is located on the insulating layer 30 and contacts, for example, the upper surface of the insulating layer 30. The light concentrator 40 is an upwardly convex lens (e.g., a microlens). The light concentrator 40 can concentrate the incident light. In other words, at least a portion of the incident light is refracted and caused to travel toward the light-receiving element 10 by the light concentrator 40.

The incident light is, for example, near-infrared light. The wavelength of the near-infrared light is, for example, not less than 0.7 micrometers (μm) and not more than 2.5 μm.

However, according to the embodiment, the incident light is not necessarily near-infrared light.

Figure 2:
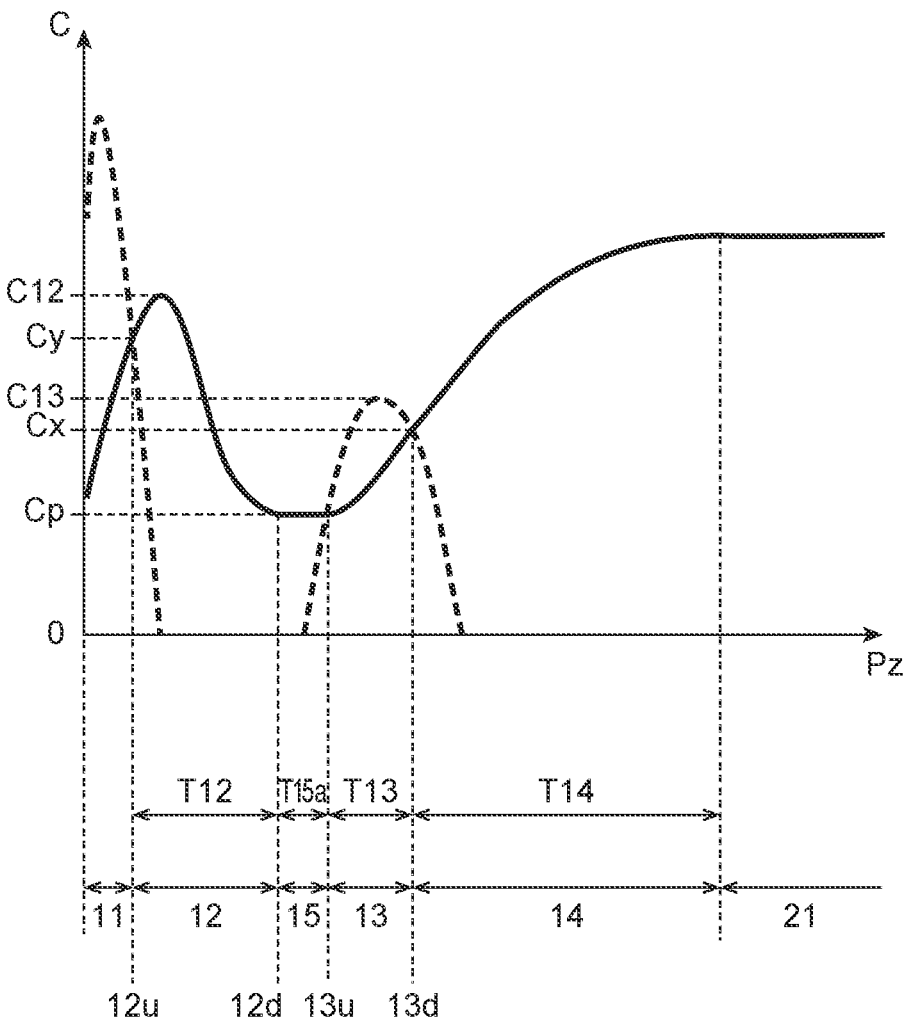
FIG. 2 is a schematic graph illustrating the distributions of the impurity concentrations in the light detector according to the embodiment.

FIG. 2 is a schematic graph illustrating the distributions of the impurity concentrations in the light detector according to the embodiment.

FIG. 2 illustrates the impurity concentrations at the central portion of the light-receiving element 10 of the light detector 101 (the impurity concentrations along a single dot-dash line L1 shown in FIG. 1). The vertical axis of FIG. 2 is an impurity concentration C (atoms per cubic centimeter (atoms/cm3)), and the horizontal axis of FIG. 2 is a position Pz (μm) in the Z-axis direction. The position at which the value of the horizontal axis is zero is the position of the light-receiving surface 10f; and the position moves downward as the value of the horizontal axis increases. In FIG. 2, the first-conductivity-type impurity concentration is illustrated by a solid line; and the second-conductivity-type impurity concentration is illustrated by a dotted line.

As illustrated in FIG. 2, the first-conductivity-type impurity concentration of the fourth semiconductor region 14 is less than the first-conductivity-type impurity concentration of the semiconductor layer 21. For example, the first-conductivity-type impurity concentration of the fourth semiconductor region 14 monotonously increases in the direction from the fifth semiconductor region 15 toward the semiconductor layer 21. The fourth semiconductor region 14 is, for example, a concentration transition region.

The first-conductivity-type impurity concentration of the fifth semiconductor region 15 is less than the first-conductivity-type impurity concentration of the second semiconductor region 12 and less than the first-conductivity-type impurity concentration of the fourth semiconductor region 14. The first-conductivity-type impurity concentration of the light-receiving element 10 has a minimum in the fifth semiconductor region 15. In other words, the fifth semiconductor region 15 is a region in which the first-conductivity-type impurity concentration has a minimum (e.g., a lowest value) in the range along the Z-axis direction from the second semiconductor region 12 to the semiconductor layer 21.

For example, the impurity concentration distribution of the first conductivity type has a peak in the second semiconductor region 12. In other words, in the example, the maximum value of the first-conductivity-type impurity concentration (a maximum impurity concentration C12) in the second semiconductor region 12 is the maximum value between an upper end 12u of the second semiconductor region 12 and a lower end 12d of the second semiconductor region 12.

The first-conductivity-type impurity concentration of the semiconductor layer 21 is, for example, not less than 1.0× 1018 (atoms/cm3) and not more than 1.0×1019 (atoms/cm3).

The first-conductivity-type impurity concentration of the second semiconductor region 12 is, for example, not less than 1.0×1016 (atoms/cm3) and not more than 1.0×1018 (atoms/cm3).

The first-conductivity-type impurity concentration of the fifth semiconductor region 15 is, for example, not less than 1.0×1013 (atoms/cm3) and not more than 1.0×1016 (atoms/cm3).

The second-conductivity-type impurity concentration of the third semiconductor region 13 is less than the second-conductivity-type impurity concentration of the first semiconductor region 11.

The second-conductivity-type impurity concentration of the first semiconductor region 11 is, for example, not less than $1.0 \times 10^{18}$ (atoms/cm3) and not more than $1.0 \times 10^{21}$ (atoms/cm3).

The second-conductivity-type impurity concentration of the third semiconductor region 13 is, for example, not less than $1.0 \times 10^{13}$ (atoms/cm3) and not more than $1.0 \times 10^{16}$ (atoms/cm3).

As illustrated in FIG. 2, for example, a concentration Cx is greater than a concentration Cp. The concentration Cx is the first-conductivity-type impurity concentration at the boundary between the third semiconductor region 13 and the fourth semiconductor region 14. The concentration Cp is the first-conductivity-type impurity concentration of the fifth semiconductor region 15. The concentration Cp is, for example, a minimum value (e.g., a lowest value) of the first-conductivity-type impurity concentration of the light-receiving element 10.

The impurity concentration at the boundary between an n-type region and a p-type region is the impurity concentration at the position (the depth) at which the n-type impurity concentration and the p-type impurity concentration are the same between the n-type region and the p-type region. In other words, the n-type impurity concentration and the p-type impurity concentration are the same at the boundary between the n-type region and the p-type region.

As illustrated in FIG. 2, for example, a concentration Cy is greater than the concentration Cx. The concentration Cy is the first-conductivity-type impurity concentration at the boundary between the first semiconductor region 11 and the second semiconductor region 12.

For example, the impurity concentration distribution of the second conductivity type has a peak in the third semiconductor region 13. In other words, in the example, the maximum value of the second-conductivity-type impurity concentration (a maximum impurity concentration C13) of the third semiconductor region 13 is the maximum value between an upper end 13u of the third semiconductor region 13 and a lower end 13d of the third semiconductor region 13. As illustrated in FIG. 2, for example, the maximum impurity concentration C13 is less than the maximum impurity concentration C12.

For example, the impurity concentrations of the semiconductor layer and the semiconductor regions are measured by SIMS (secondary ion mass spectrometry).

In the example, a thickness (a length along the Z-axis direction) T13 of the third semiconductor region 13 is less than a thickness T12 of the second semiconductor region 12. For example, a thickness T15a (the thickness of the portion 15a) of the fifth semiconductor region 15 is less than the thickness T13 of the third semiconductor region 13. For example, a thickness T14 of the fourth semiconductor region 14 is greater than the thickness T12 of the second semiconductor region 12.

The thickness T12 is, for example, not less than 1 μm and not more than 4 μm. The thickness T13 is, for example, not less than 0.5 μm and not more than 4 μm. The thickness T14 is, for example, not less than 1 μm and not more than 7 μm. The thickness T15a is, for example, not less than 0 μm and not more than 8 μm.

Materials of the components of the light detector 101 will now be described.

The semiconductor layer 21 and the semiconductor layer 22 (the first semiconductor region 11, the second semiconductor region 12, the third semiconductor region 13, the fourth semiconductor region 14, and the fifth semiconductor region 15) include at least one semiconductor material selected from the group consisting of silicon, silicon carbide, gallium arsenide, and gallium nitride. For example, the semiconductor layer 21 and the semiconductor layer 22 include silicon. The first semiconductor region 11 and the third semiconductor region 13 each are obtained by implanting, for example, phosphorus, arsenic, or antimony as an n-type impurity into silicon. The second semiconductor region 12 is obtained by implanting, for example, boron as a p-type impurity into silicon.

The semiconductor layer 22 is, for example, an epitaxial layer formed on a substrate (the semiconductor layer 21). For example, the first semiconductor region 11, the second semiconductor region 12, and the third semiconductor region 13 can be formed by ion implantation into an epitaxial layer that includes the fourth and fifth semiconductor regions 14 and 15 and is formed by epitaxial growth on the semiconductor layer 21. For example, the third semiconductor region 13 is formed by implanting the second-conductivity-type impurity to overlap the fourth semiconductor region 14 in which the concentration of the first-conductivity-type impurity transitions. For example, the region of the epitaxial layer into which an impurity is not ion-implanted can be used to form the fifth semiconductor region 15.

The structure part 70 includes a different material from the material of the semiconductor layer 22 (the light-receiving element 10). Specifically, the structure part 70 includes an insulating material. For example, the structure part 70 includes silicon and one selected from the group consisting of oxygen and nitrogen. For example, the structure part 70 includes silicon oxide or silicon nitride. The structure part 70 may have a stacked structure.

The light concentrator 40 includes a light-transmissive material. For example, the light concentrator 40 includes a light-transmissive resin such as an acrylic resin, etc.

The insulating layer 30 includes, for example, a light-transmissive material. For example, the insulating layer 30 includes silicon and one selected from the group consisting of oxygen and nitrogen. For example, the insulating layer 30 includes at least one of silicon oxide or silicon nitride.

The electrode 50 includes, for example, at least one metal selected from the group consisting of titanium, tungsten, copper, gold, aluminum, indium, and tin. This is similar for a conductive part 61, the pad 55, and the wiring parts described below as well.

Operations of the light detector 101 will now be described.

The incident light that is incident on the upper surface of the light concentrator 40 from above is concentrated toward the light-receiving element 10 by the light concentrator 40. The incident light that is incident on the upper surface of the light concentrator 40 passes through the light concentrator 40 and the insulating layer 30 and enters the light-receiving element 10 through the light-receiving surface 10f.

For example, the light-receiving element 10 functions as a p-i-n diode or an avalanche photodiode. A charge is generated in the semiconductor layer 22 when the light is incident on the light-receiving element 10. When the charge is generated, a current flows in the wiring parts and the like (e.g., the conductive part 61, a quenching part 63, and the first wiring part 51 described below) that are electrically connected with the first semiconductor region. The incidence of the light on the light-receiving element 10 can be detected by detecting the current flowing in the wiring parts and the like as an output.

The conductive part 61 and the electrode 50 drive the light-receiving element by applying a voltage to the first to fifth semiconductor regions 11 to 15. The voltage can be applied to the light-receiving element 10 by controlling the potentials of the pad 55 and the electrode 50. For example, a voltage can be applied between the first semiconductor region 11 and the second semiconductor region 12, between the third semiconductor region 13 and the second semiconductor region 12 (or the fifth semiconductor region 15), and between the third semiconductor region 13 and the fourth semiconductor region 14 by controlling the potential of the electrode 50. For example, a negative voltage with respect to the pad 55 is applied to the electrode 50. Thereby, a reverse voltage is applied between the first semiconductor region 11 and the fourth semiconductor region 14. A reverse voltage that is greater than the breakdown voltage may be applied to the light-receiving element 10 (between the first semiconductor region 11 and the fourth semiconductor region 14). In other words, the light-receiving element 10 may include an avalanche photodiode that operates in a Geiger mode. By operating in a Geiger mode, a pulse signal of a high multiplication factor (i.e., a high gain) is output. The light-receiving sensitivity of the light detector can be increased thereby.

For example, at the vicinity of the p-n junction formed between the first semiconductor region 11 and the second semiconductor region 12 of the light-receiving element 10, a high electric field region is formed, and a multiplication region is formed in which avalanche amplification of carriers occurs. For example, if there are few crystal defects inside the semiconductor layer 22, the charge that is generated inside the light-receiving element 10 is moved by drifting or diffusing into the multiplication region, and is amplified and detected.

A depletion layer is formed inside the light-receiving element 10 by the p-n junction. For example, the width in the vertical direction of the depletion layer is increased by the conductive part 61 and the electrode 50 applying a reverse voltage to the light-receiving element 10.

For example, inside the light-receiving element 10, the electric field intensity outside the depletion layer is less than the electric field intensity inside the depletion layer. It is considered that the movement speed of the charge generated inside the light-receiving element 10 is lower outside the depletion layer than inside the depletion layer. Therefore, for example, there are cases where the time until the charge generated outside the depletion layer moves to the first semiconductor region 11 side (the multiplication region) and is detected is greater than the time until the charge generated inside the depletion layer moves to the first semiconductor region 11 side (the multiplication region) and is detected. In other words, it is considered that the time until being detected as a current is different between the positions at which the charges are generated. It is considered that when the charge is generated outside the depletion layer, the time until being detected is long, and a lag component occurs in the detected current value. For example, there is a risk that the time from the photon being incident on the light-receiving element until being detected as a current may fluctuate. For example, when the light detector is used in a time-of-flight lidar device described below, there is a possibility that fluctuation (jitter) of the detection time may affect the ranging accuracy.

The depletion layer spreads from the p-n junction surface between the first semiconductor region 11 and the second semiconductor region 12 toward the fourth semiconductor region 14. As described above, the first-conductivity-type impurity concentration of the fourth semiconductor region 14 is relatively high. It is therefore relatively difficult for the depletion layer to spread inside the fourth semiconductor region 14. There are cases where the time until the charge generated in the fourth semiconductor region 14 is detected as a current is relatively long.

In contrast, according to the embodiment, the third semiconductor region 13 is provided in addition to the p-n junction between the first semiconductor region 11 and the second semiconductor region 12. The responsivity of the detector can be improved thereby. For example, the depletion layer can be extended further toward the fourth semiconductor region 14. In other words, the lower end of the depletion layer can be lower. For example, the depletion layer can be easily spread inside the fourth semiconductor region 14. For example, the charge that is generated inside the depletion layer can drift due to the electric field of the depletion layer and can reach the first semiconductor region 11 side (the multiplication region) in a short travel time. For example, fluctuation of the time until the charge generated inside the light-receiving element 10 is detected as a current can be suppressed.

In the example, the third semiconductor region 13 contacts the fourth semiconductor region 14. Thereby, for example, the depletion layer can be formed lower inside the fourth semiconductor region 14. In other words, the depletion layer inside the fourth semiconductor region 14 can be extended.

The fifth semiconductor region 15 in which the first-conductivity-type impurity concentration is a minimum is located between the second semiconductor region 12 and the third semiconductor region 13. The fifth semiconductor region 15 is easily depleted due to the relatively low impurity concentration. Thereby, for example, the depletion layer of the light-receiving element 10 can be wide in the vertical direction.

For example, the second-conductivity-type impurity concentration of the lower end 13d of the third semiconductor region 13 (equal to the concentration Cx of the example of FIG. 2) is greater than the second-conductivity-type impurity concentration of the upper end 13u of the third semiconductor region 13 (equal to the concentration Cp of the example of FIG. 2). By setting the second-conductivity-type impurity concentration to be high at a deeper position, for example, the depletion layer inside the fourth semiconductor region 14 can be extended further downward.

As described above with reference to FIG. 2, the impurity concentration Cy of the first conductivity type at the boundary between the first semiconductor region 11 and the second semiconductor region 12 is greater than the impurity concentration Cx of the first conductivity type at the boundary between the third semiconductor region 13 and the fourth semiconductor region 14. Thereby, for example, the depletion layer is caused to spread from the p-n junction surface between the first semiconductor region 11 and the second semiconductor region 12 toward the fourth semiconductor region 14. For example, the electric field at the p-n junction surface vicinity between the first semiconductor region 11 and the second semiconductor region 12 becomes high, and the charge that is generated inside the light-receiving element 10 moves easily toward the first semiconductor region 11 side.

For example, the maximum value of the second-conductivity-type impurity concentration (a concentration C13) of the third semiconductor region 13 is less than the maximum value of the first-conductivity-type impurity concentration (a concentration C12) of the second semiconductor region 12. Thereby, for example, the concentration Cy is easily set to be greater than the concentration Cx.

For example, as illustrated in FIG. 1, a lower end Dd of a depletion layer D formed when the light-receiving element 10 operates is positioned inside the fourth semiconductor region 14. An upper end Du of the depletion layer D formed when the light-receiving element 10 operates is positioned inside the first semiconductor region 11. Thus, for example, the depletion layer continuously spreads from the first semiconductor region 11 to the fourth semiconductor region 14. Because the depletion layer is wide, for example, the time until the charge generated inside the light-receiving element 10 is detected as a current can be shortened.

"When the light-receiving element operates" is the time at which the light-receiving element performs the operation of detecting light in the product including the light detector. For example, when the light-receiving element 10 operates, a voltage is applied between the first semiconductor region 11 and the fourth semiconductor region 14 by applying a prescribed voltage between the electrodes (between the conductive part 61 and the electrode 50). When the light-receiving element 10 is an avalanche photodiode, the potential difference (the absolute value) between the electrodes is set to a value that is greater than the breakdown voltage. The potential difference may be, for example, a value that is about 5 V greater than the breakdown voltage. Thus, the lower end Dd of the depletion layer D is positioned inside the fourth semiconductor region 14 when the voltage is applied when operating. For example, the range (the position of the end portion) of the depletion layer can be estimated by a calculation such as a simulation or the like based on the impurity concentration distribution and voltage conditions when operating the light-receiving element. Or, the depletion layer width may be estimated based on the electrical capacitance of the light-receiving element; and the range of the depletion layer may be estimated based on the depletion layer width.

The third semiconductor region 13 is arranged with the structure part 70 in the X-axis direction. For example, the incidence of secondary photons and/or the movement of carriers into an adjacent light-receiving element 10 is suppressed by the structure part 70 at the vicinity of the depletion layer formed in the third semiconductor region 13. For example, the increase of crosstalk noise can be suppressed even when the third semiconductor region 13 is provided and the depletion layer spreads.

Figure 3:
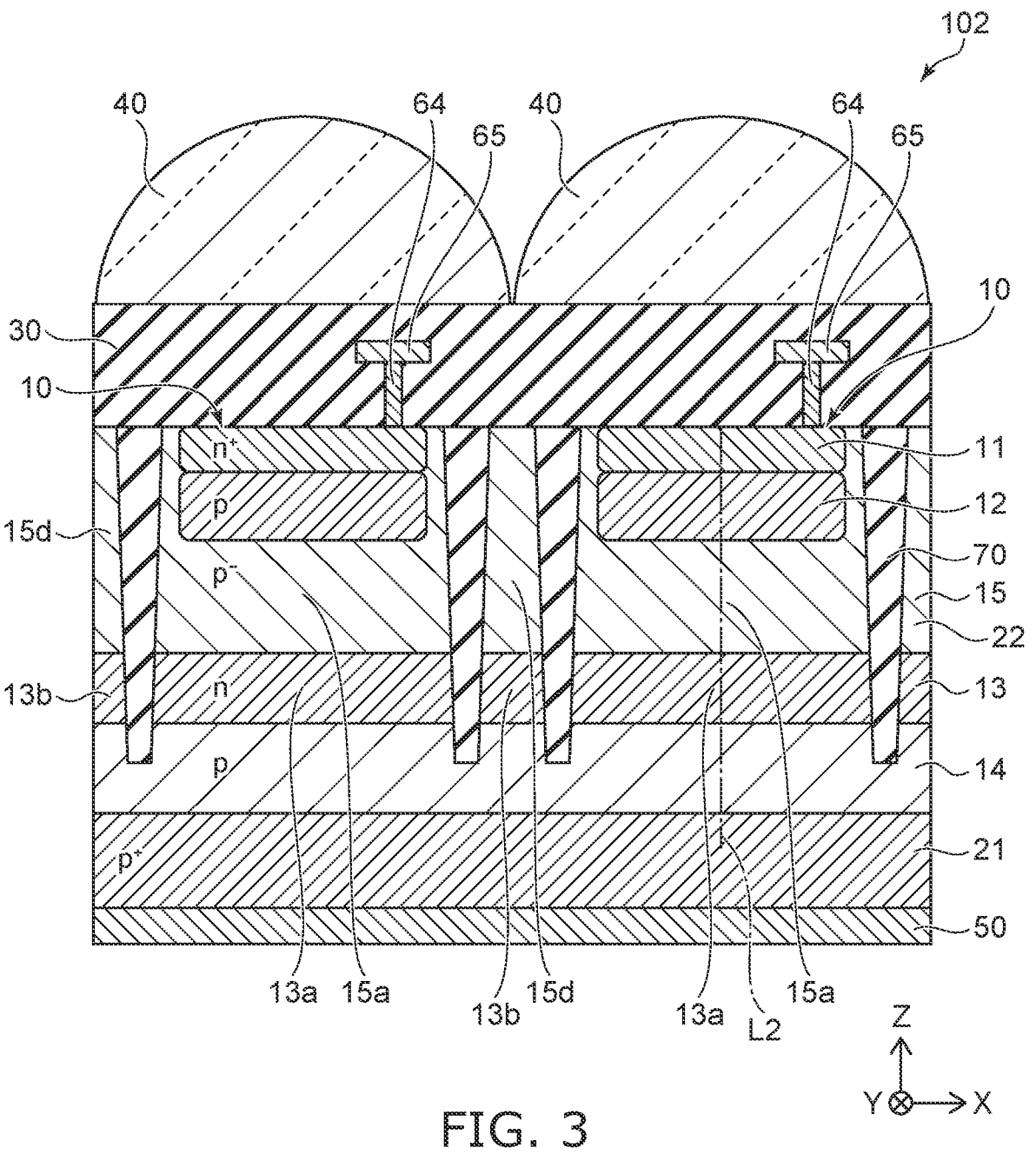
FIG. 3 is a schematic cross-sectional view illustrating a light detector according to the embodiment.

FIG. 3 is a schematic cross-sectional view illustrating a light detector according to the embodiment.

FIG. 3 illustrates the light detector 102 according to the embodiment. In the example, multiple light-receiving elements 10, multiple structure parts 70, and multiple light concentrators 40 are arranged in the X-Y plane. The numbers of components are not limited thereto; the number of the light-receiving elements 10, the number of the structure parts 70, and the number of the light concentrators 40 each may be one or more. The planar shape of the third semiconductor region 13 and the thickness of the semiconductor layer 22 of the light detector 102 are different from those of the light detector 101.

As illustrated in FIG. 3, the third semiconductor region 13 includes multiple portions 13a and multiple portions 13b. The multiple second semiconductor regions 12 are located respectively on the multiple portions 13a. The multiple first semiconductor regions 11 are located respectively on the multiple second semiconductor regions 12. For example, the portion 13a is surrounded with the ring-shaped structure part 70. For example, the portion 13a contacts the structure part 70 and the portion 15a of the fifth semiconductor region 15.

The portion 13b is positioned between adjacent portions 13a. For example, the portion 13b is located at the outer side of the structure part 70. For example, the portion 13b contacts the structure part 70 and the portion 15d of the fifth semiconductor region 15.

Thus, the third semiconductor region 13 and the fourth semiconductor region 14 may extend over the multiple light-receiving elements 10. For example, the structure part 70 extends through the third semiconductor region 13 and reaches the fourth semiconductor region 14. The portion 13a and the portion 13b of the third semiconductor region 13 may be partitioned by the structure part 70. In other words, the portion 13b may be separated from the portion 13a.

Figure 4:
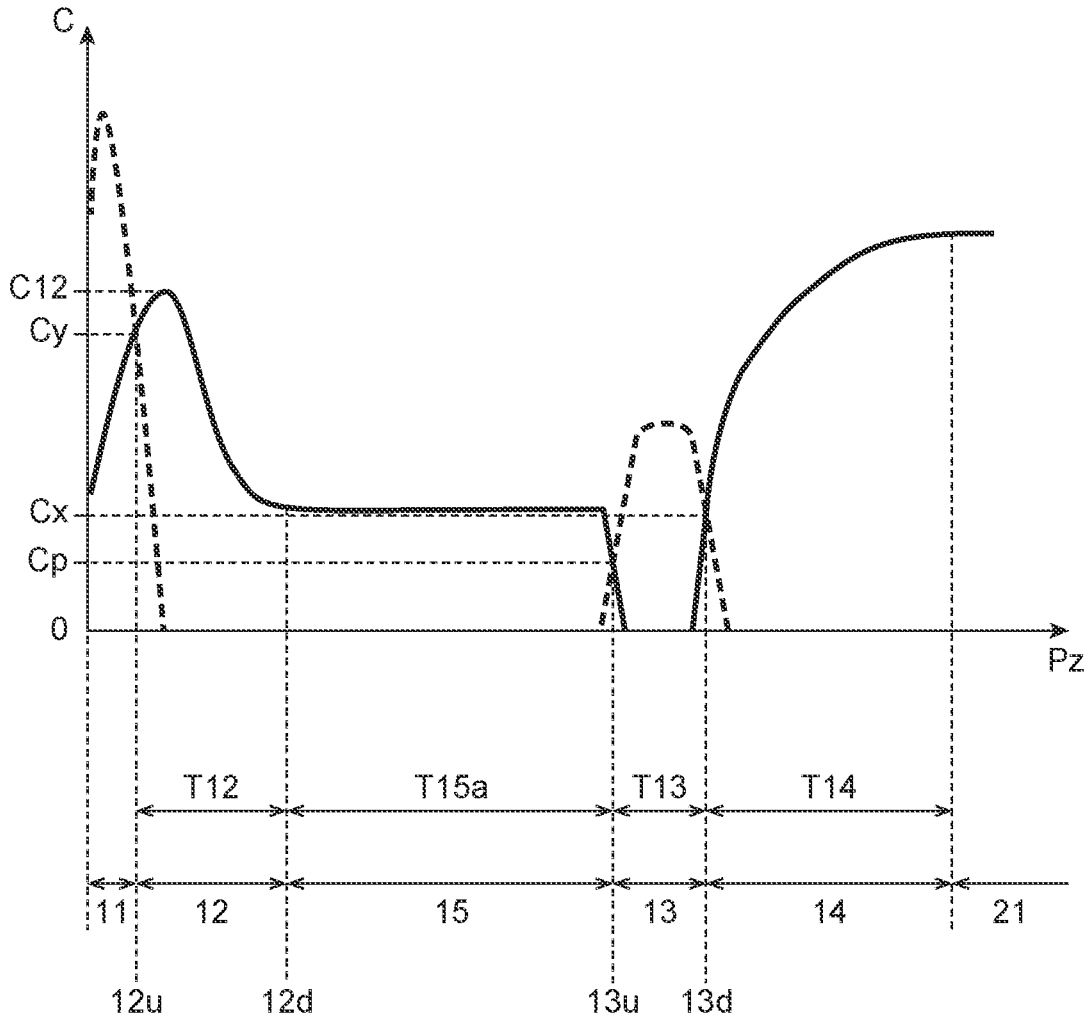
FIG. 4 is a schematic graph illustrating the distributions of the impurity concentrations in the light detector according to the embodiment.

FIG. 4 is a schematic graph illustrating the distributions of the impurity concentrations in the light detector according to the embodiment.

FIG. 4 illustrates the impurity concentrations at the central portion of the light-receiving element 10 of the light detector 102 (the impurity concentrations along a single dot-dash line L2 shown in FIG. 3). Similarly to FIG. 2, FIG. 4 illustrates the relationship between the impurity concentration C and the position Pz in the Z-axis direction; the first-conductivity-type impurity concentration is shown by a solid line; and the second-conductivity-type impurity concentration is shown by a dotted line. In the example as well, for example, the concentration Cx is greater than the concentration Cp; and the concentration Cy is greater than concentration Cx.

For example, the thickness T15a (the thickness of the portion 15a) of the fifth semiconductor region 15 between the second semiconductor region 12 and the third semiconductor region 13 is greater than the thickness T13 of the third semiconductor region 13. For example, the thickness of a region of the fifth semiconductor region 15 in which the first-conductivity-type impurity concentration is constant along the Z-axis direction is greater than the thickness T13 of the third semiconductor region 13. For example, the width in the vertical direction of the depletion layer can be increased by increasing the thickness of the fifth semiconductor region 15 that has a relatively low impurity concentration. For example, the sensitivity can be increased by making the fifth semiconductor region 15 thick.

The thickness T15a of the fifth semiconductor region 15 may be greater than the thickness T12 of the second semiconductor region 12 and may be greater than the thickness T14 of the fourth semiconductor region 14. In the example, the thickness T15a of the fifth semiconductor region 15 is, for example, not less than 0.5 μm and not more than 25 μm.

When the thickness T15a of the fifth semiconductor region 15 is thick, for example, the third semiconductor region 13 may be formed by doping a portion of the semiconductor layer 22 with an impurity when epitaxially growing the semiconductor layer 22 on the semiconductor layer 21.

In the example of FIG. 4, the second-conductivity-type impurity concentration of the third semiconductor region 13 is high is a region between the upper end 13u and the lower end 13d of the third semiconductor region 13.

Figure 5:
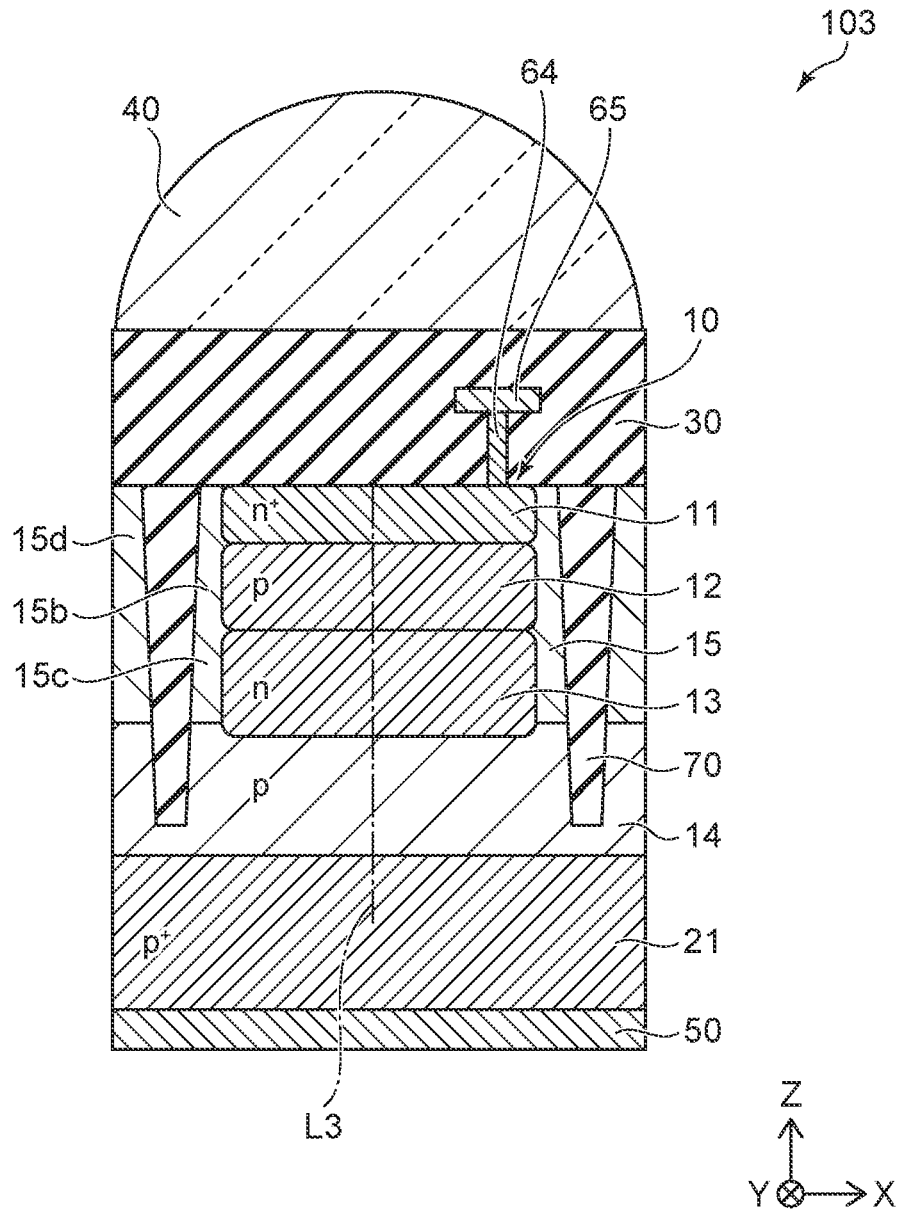
FIG. 5 is a schematic cross-sectional view illustrating a light detector according to the embodiment.

FIG. 5 is a schematic cross-sectional view illustrating a light detector according to the embodiment.

FIG. 5 illustrates the light detector 103 according to the embodiment. The thicknesses of the third and fifth semiconductor regions 13 and 15 of the light detector 103 are different from the light detector 101.

In the example, the third semiconductor region 13 contacts the second semiconductor region 12. In other words, a portion (the portion 15a) of the fifth semiconductor region 15 may not be located between the second semiconductor region 12 and the third semiconductor region 13.

Figure 6:
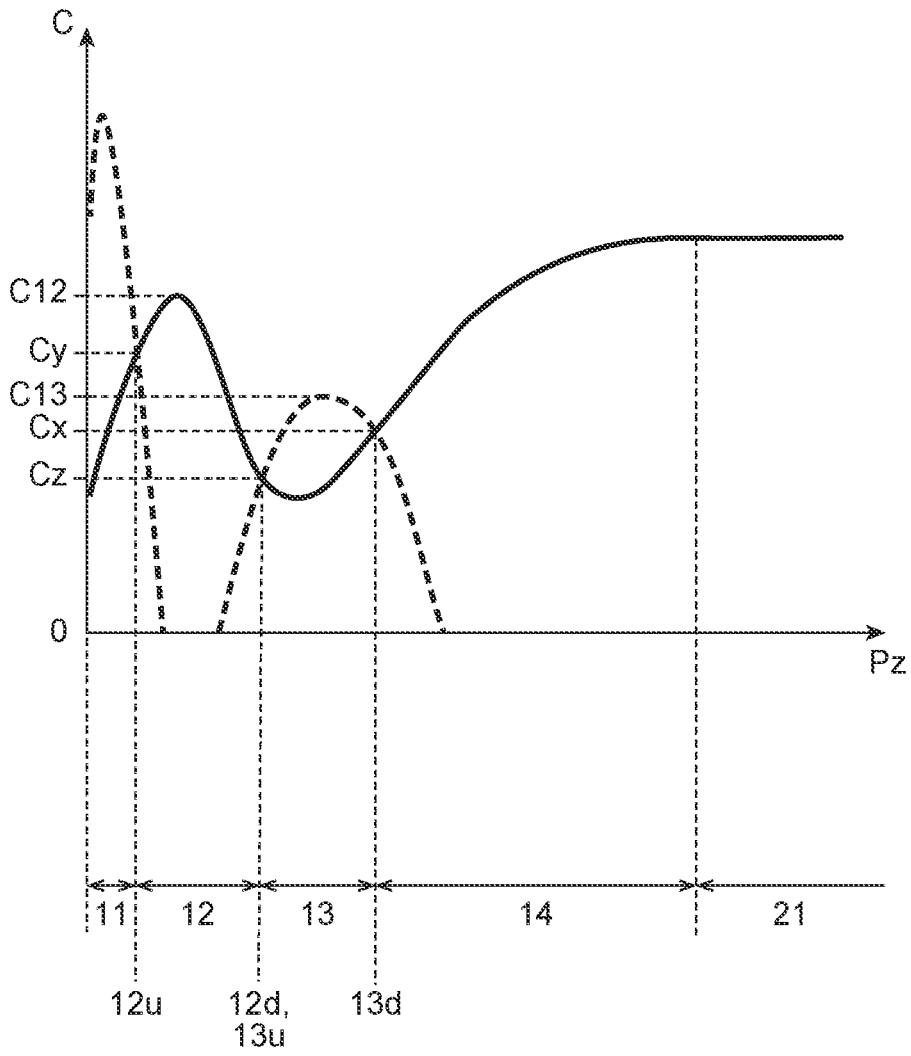
FIG. 6 is a schematic graph illustrating the distributions of the impurity concentrations in the light detector according to the embodiment.

FIG. 6 is a schematic graph illustrating the distributions of the impurity concentrations in the light detector according to the embodiment.

FIG. 6 illustrates the impurity concentrations at the central portion of the light-receiving element 10 of the light detector 103 (the impurity concentrations along a single dot-dash line L3 shown in FIG. 5). Similarly to FIG. 2, FIG. 6 illustrates the relationship between the impurity concentration C and the position Pz in the Z-axis direction; the first-conductivity-type impurity concentration is shown by a solid line; and the second-conductivity-type impurity concentration is shown by a dotted line. In the example as well, for example, the concentration Cy is greater than the concentration Cx.

For example, the concentration Cx is greater than a concentration Cz. The concentration Cz is the first-conductivity-type impurity concentration at the boundary between the second semiconductor region 12 and the third semiconductor region 13. The second-conductivity-type impurity concentration is relatively high at the boundary between the third semiconductor region 13 and the fourth semiconductor region 14 that has a high impurity concentration and is not easily depleted. Thereby, for example, the depletion layer inside the fourth semiconductor region 14 can be extended further downward.

Figure 7:
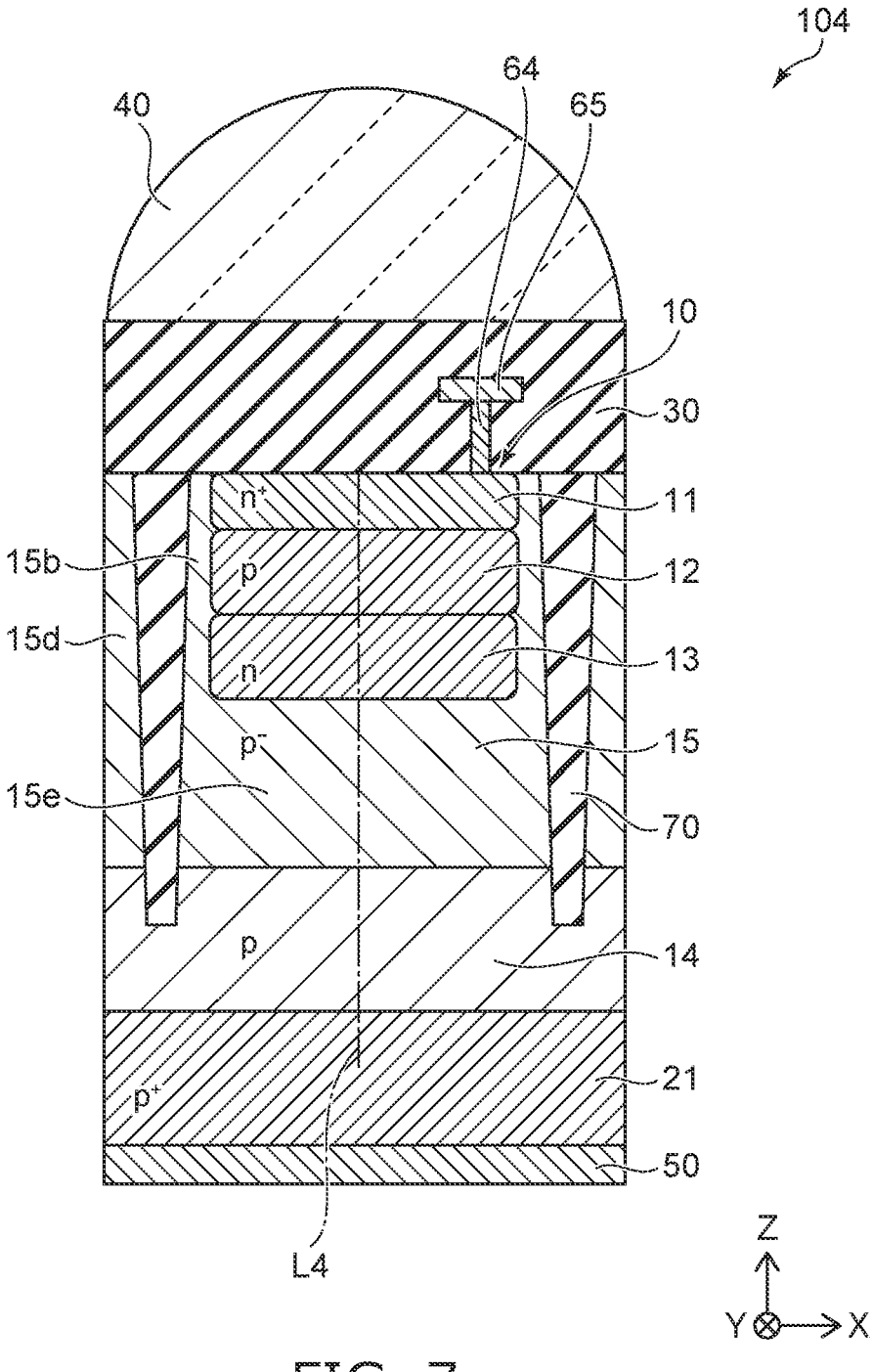
FIG. 7 is a schematic cross-sectional view illustrating a light detector according to the embodiment.

FIG. 7 is a schematic cross-sectional view illustrating a light detector according to the embodiment.

FIG. 7 illustrates the light detector 104 according to the embodiment. The thickness of the fifth semiconductor region 15 and the location of the third semiconductor region 13 of the light detector 104 are different from those of the light detector 101. In the example, the third semiconductor region 13 contacts the second semiconductor region 12 and is separated from the fourth semiconductor region 14.

For example, the fifth semiconductor region 15 includes a portion 15e instead of the portion 15a. The portion 15e is located between the third semiconductor region 13 and the fourth semiconductor region 14. The portion 15e contacts the third and fourth semiconductor regions 13 and 14.

Figure 8:
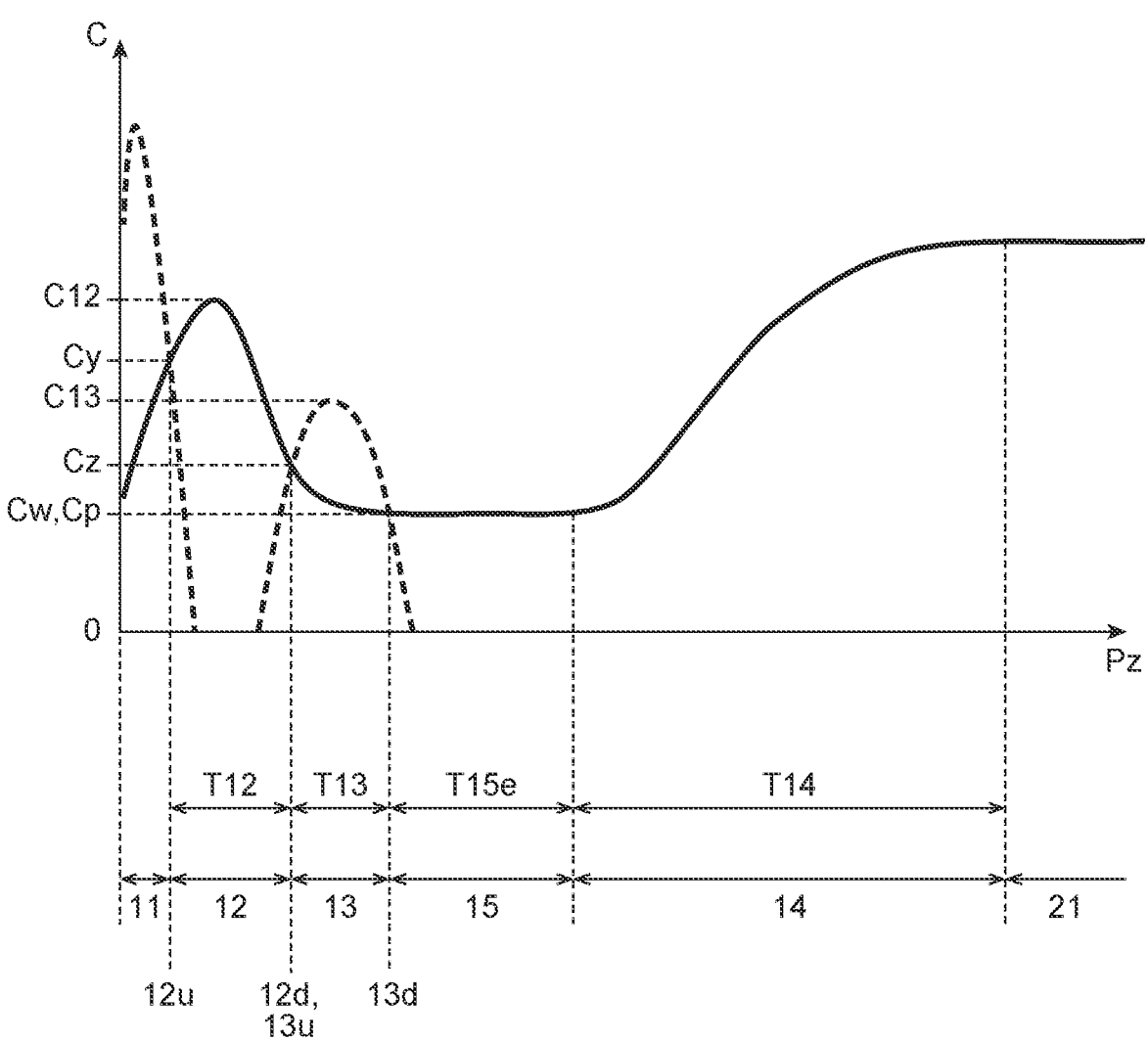
FIG. 8 is a schematic graph illustrating the distributions of the impurity concentrations in the light detector according to the embodiment.

FIG. 8 is a schematic graph illustrating the distributions of the impurity concentrations in the light detector according to the embodiment.

FIG. 8 illustrates the impurity concentrations at the central portion of the light-receiving element 10 of the light detector 104 (the impurity concentrations along a single dot-dash line L4 shown in FIG. 7). Similarly to FIG. 2, FIG. 8 illustrates the relationship between the impurity concentration C and the position Pz in the Z-axis direction; the first-conductivity-type impurity concentration is shown by a solid line; and the second-conductivity-type impurity concentration is shown by a dotted line.

As illustrated in FIG. 8, the fifth semiconductor region 15 (the portion 15e) in which the first-conductivity-type impurity concentration has a minimum is located between the third semiconductor region 13 and the fourth semiconductor region 14. The fifth semiconductor region 15 has a low impurity concentration and is depleted relatively easily. For example, the width in the vertical direction of the depletion layer can be increased thereby.

In the example of FIG. 8, a concentration Cw is less than the concentration Cz. The concentration Cw is the first-conductivity-type impurity concentration at the boundary between the third semiconductor region 13 and the fifth semiconductor region 15. The second-conductivity-type impurity concentration of the lower end 13d of the third semiconductor region 13 may be less than the second-conductivity-type impurity concentration of the upper end 13u.

For example, a thickness T15e of the fifth semiconductor region 15 (the thickness of the portion 15e) is greater than the thickness T13 of the third semiconductor region 13. By making the fifth semiconductor region 15 thick, for example, the sensitivity can be increased. The thickness T15e of the fifth semiconductor region 15 may be greater than the thickness T12 of the second semiconductor region 12 and may be greater than the thickness T14 of the fourth semiconductor region 14.

The thicknesses are not limited to those described above; according to the embodiment, the fifth semiconductor region 15 may include both the portion 15a between the second semiconductor region 12 and the third semiconductor region 13 and the portion 15e between the third semiconductor region 13 and the fourth semiconductor region 14. In other words, the third semiconductor region 13 may be separated from the second semiconductor region 12 and may be separated from the fourth semiconductor region 14.

Figure 9:
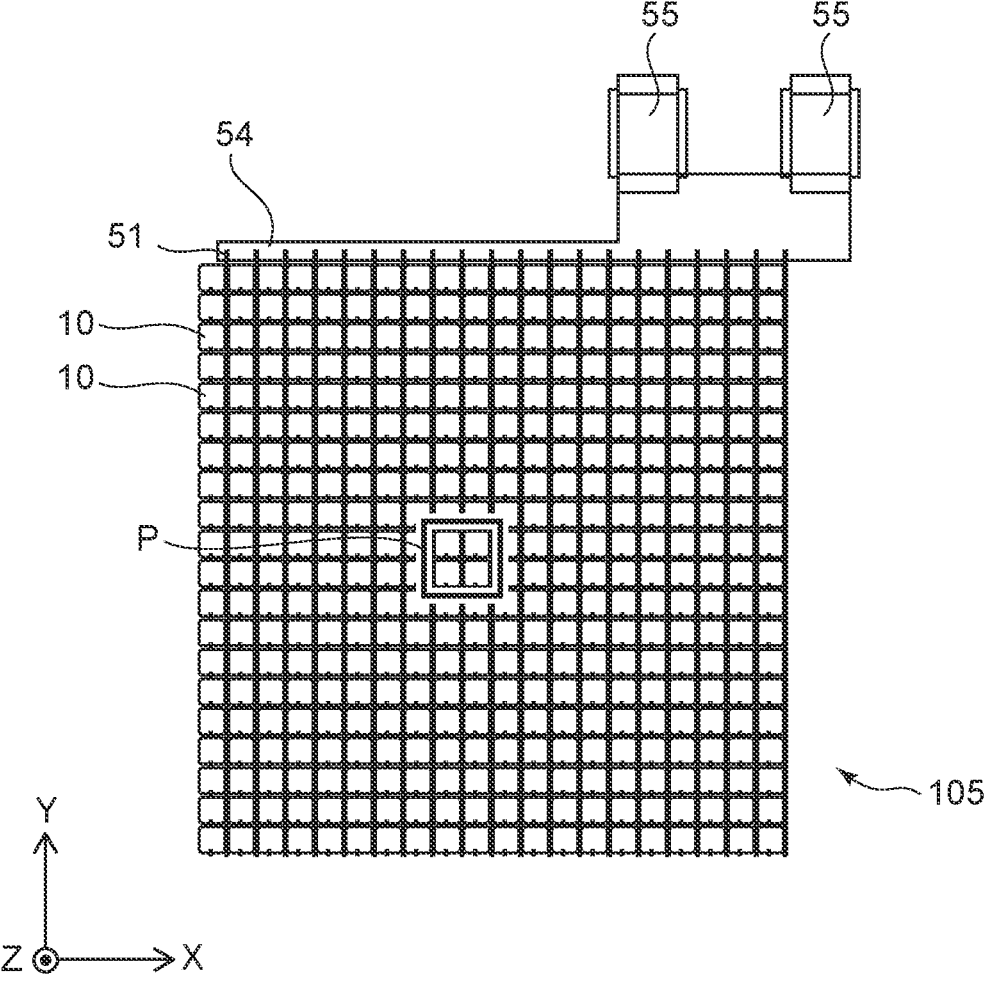
FIG. 9 is a schematic plan view illustrating another light detector according to the embodiment.

FIG. 9 is a schematic plan view illustrating another light detector according to the embodiment.

The light detector 105 illustrated in FIG. 9 includes multiple element structures similar to the structure described with reference to FIG. 1, etc. The multiple element structures are arranged in an array configuration along the X-Y plane. For example, the multiple element structures are arranged periodically at a uniform pitch in the X-axis direction and the Y-axis direction. In other words, the light detector 105 includes the electrode 50, the semiconductor layer 21, the multiple light-receiving elements 10, the multiple structure parts 70, the multiple light concentrators 40 (the microlens array), and the insulating layer 30. In the adjacent element structures, the electrodes 50 are continuous with each other; the semiconductor layers 21 are continuous with each other; the semiconductor layers 22 are continuous with each other; and the insulating layers 30 are continuous with each other.

As shown in FIG. 9, the light detector 105 further includes the multiple first wiring parts 51, a common line 54, and the pad 55 (an electrode). One first wiring part 51 is electrically connected to the multiple light-receiving elements 10 that are arranged in the Y-axis direction. The multiple first wiring parts 51 that are arranged in the X-axis direction are electrically connected with the common line 54. The common line 54 is electrically connected with not less than one pad 55. A wiring part of an external device is electrically connected to the pad 55.

Figure 10:
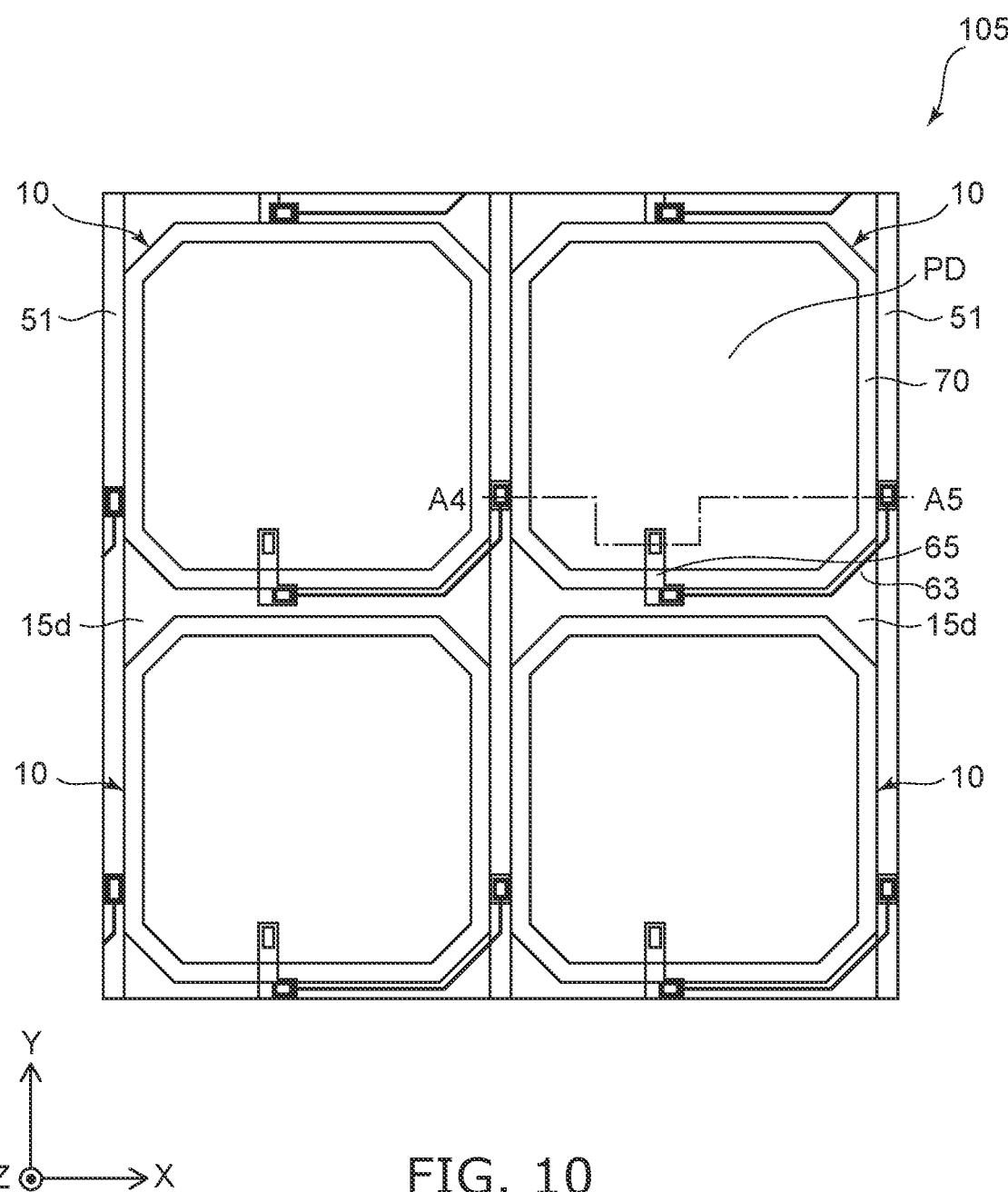
FIG. 10 is a schematic plan view illustrating a portion of the light detector according to the embodiment.

FIG. 10 is a schematic plan view illustrating a portion of the light detector according to the embodiment.

Figure 11:
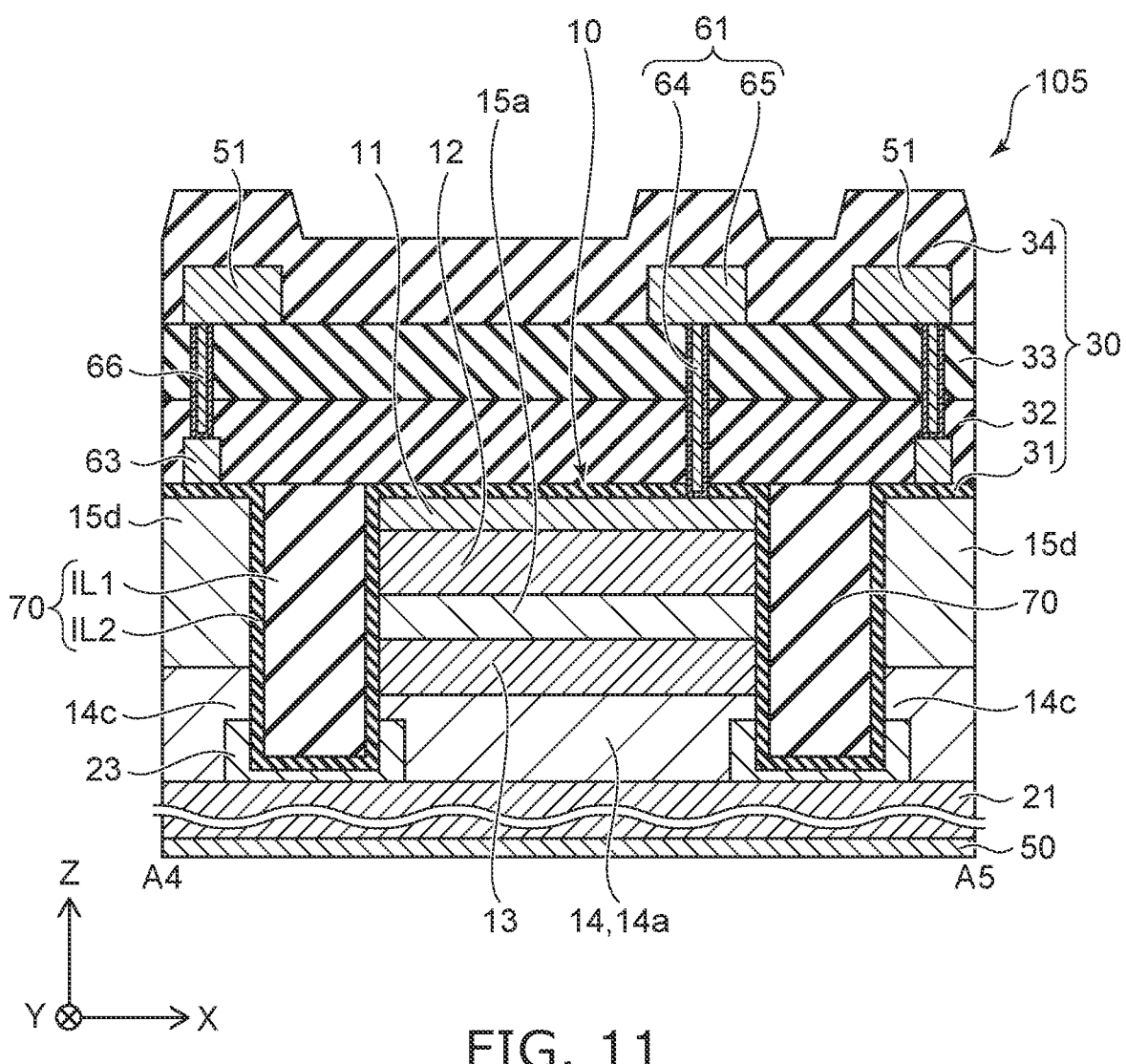
FIG. 11 is a schematic cross-sectional view illustrating a portion of the light detector according to the embodiment.

FIG. 11 is a schematic cross-sectional view illustrating a portion of the light detector according to the embodiment.

FIG. 10 illustrates an enlarged region P of the light detector 105 shown in FIG. 9. The light concentrator 40 and the insulating layer 30 are not illustrated in FIG. 10. FIG. 11 shows an A4-A5 cross section of FIG. 10.

As illustrated in FIG. 10, the light-receiving element 10 includes a photodiode PD. For example, the photodiode PD is formed of the first semiconductor region 11, the second semiconductor region 12, the third semiconductor region 13 (the portion 13a), the fourth semiconductor region (the portion 14a), and the fifth semiconductor region (at least one of the portion 15a or the portion 15e).

The structure part 70 surrounds the light-receiving element 10 (the photodiode PD). In the example, the structure part 70 is substantially octagonal when viewed along the Z-axis direction. The multiple structure parts 70 respectively surround the multiple light-receiving elements 10 along the X-Y plane. For example, the planar shape in the X-Y plane of the structure part 70 is a polygonal ring shape. The structure part 70 may be quadrilateral when viewed from the Z-axis direction.

According to the embodiment, "ring-shaped" includes not only when the exterior shape of the planar shape when viewed from above is circular but also when the exterior shape is polygonal. "Polygonal" includes polygonal with curved (rounded) corners. In other words, "polygonal" may be a shape that includes multiple sides (straight lines) and curves connecting the sides to each other. "Ring-shaped" may include not only a continuous ring shape without breaks but also circular or polygonal (e.g., substantially C-shaped) having one or more breaks. For example, the structure part 70 may discontinuously surround the light-receiving element 10 when viewed from the Z-axis direction. In other words, when viewed from the Z-axis direction, the structure part 70 may not have a perfect ring structure and may have a partially open shape.

According to the embodiment, "surround" includes not only the case where an unbroken component continuously surrounds another component, but also the case where multiple components are separated from each other and arranged around the other component. For example, the other component can be considered to be surrounded with the multiple components when the other component is positioned inside a trajectory obtained by tracing along the multiple components. The other component can be considered to be surrounded with a circular shape or a polygon when the other component is positioned inside a circular shape or a polygon having one or more breaks when viewed in plan from above.

The structure part 70 can suppress the conduction and the optical interference between the adjacent light-receiving elements 10. For example, the movement of secondary photons and carriers between the light-receiving elements 10 is suppressed by the structure part 70. When secondary photons are generated by light being incident on the light-receiving element 10, the secondary photons that travel toward the adjacent light-receiving elements 10 are reflected and refracted at the interface of the structure part 70. Crosstalk noise can be reduced by providing the structure part 70.

The multiple structure parts 70 are provided independently for each element. In other words, the multiple structure parts 70 are separated and do not physically contact each other. Compared to when one separation structure is located between the adjacent light-receiving elements 10, the number of interfaces of the structure part 70 between the adjacent light-receiving elements 10 is increased. By increasing the number of interfaces, when secondary photons are generated in the light-receiving element 10, the secondary photons that travel toward the adjacent light-receiving elements 10 are more easily reflected. Crosstalk noise can be further reduced thereby. An outer perimeter region (the portion 15d of the fifth semiconductor region 15) is positioned between two mutually-adjacent structure parts 70. For example, the outer perimeter region extends in the Y-axis direction between the structure parts 70 that are adjacent in the X-axis direction. The outer perimeter region extends in the X-axis direction between the structure parts 70 that are adjacent in the Y-axis direction.

As illustrated in FIG. 11, the structure part 70 may include a first insulating layer IL1 and a second insulating layer IL2. The second insulating layer IL2 is located between the first insulating layer IL1 and the light-receiving element 10 and between the first insulating layer IL1 and the semiconductor layer 21. For example, the first insulating layer IL1 and the second insulating layer IL2 include silicon oxide; and the second insulating layer IL2 has a dense structure compared to the first insulating layer IL1.

As illustrated in FIG. 11, the fourth semiconductor region 14 may include a p-type semiconductor region 23 located between the semiconductor layer 21 and the structure part 70 in the Z-axis direction. For example, the p-type impurity concentration of the semiconductor region 23 is greater than the p-type impurity concentration of the portion 14a or the portion 14c of the fourth semiconductor region 14.

The quenching part 63 is provided to suppress the continuation of avalanche breakdown when light is incident on the light-receiving element 10 and avalanche breakdown occurs. When avalanche breakdown occurs and a current flows in the quenching part 63, a voltage drop that corresponds to the electrical resistance of the quenching part 63 occurs. The potential difference between the first semiconductor region 11 and the second semiconductor region 12 is reduced by the voltage drop; and the avalanche breakdown stops. The next light that is incident on the light-receiving element 10 can be detected thereby.

In the example, a quenching resistance is electrically connected to each light-receiving element 10 as the quenching part 63. The resistance of the quenching part 63 is, for example, not less than 50 kΩ and not more than 6 MΩ. The quenching resistance includes, for example, polysilicon as a semiconductor material. An n-type impurity or a p-type impurity may be added to the quenching resistance.

For example, when viewed from the Z-axis direction, the quenching part 63 exists at a different position from the photodiode PD. For example, the quenching part 63 is arranged with the structure part 70 or the portion 15d of the fifth semiconductor region 15 in the Z-axis direction. The quenching part 63 is electrically connected with the conductive part 61. Thereby, one end of the quenching part 63 is electrically connected with the first semiconductor region 11 via the conductive part 61. Multiple quenching parts 63 are included, and the multiple quenching parts 63 are electrically connected respectively with the multiple first semiconductor regions 11. Another end of the quenching part 63 is electrically connected with the first wiring part 51.

The multiple conductive parts 61 are connected respectively to the multiple light-receiving elements 10. Each of the multiple conductive parts 61 includes the contact 64 and the interconnect 65. The quenching part 63 is electrically connected with the first semiconductor region 11 via the contact 64 and the interconnect 65, and is electrically connected with the first wiring part 51 via a contact 66.

The contacts 64 and 66 include a metal material. For example, the contacts 64 and 66 include at least one selected from the group consisting of titanium, tungsten, copper, and aluminum. The contacts 64 and 66 may include a conductor made of a silicon compound or a nitride of at least one selected from the group consisting of titanium, tungsten, copper, and aluminum.

For example, the position in the Z-axis direction of the quenching part 63 is between the position in the Z-axis direction of the first semiconductor region 11 and the position in the Z-axis direction of the first wiring part 51. One first wiring part 51 is electrically connected with the multiple photodiodes PD arranged in the Y-axis direction.

The electrical resistance of the quenching part 63 is greater than the electrical resistances of the contact 64, the contact 66, and the interconnect 65. The quenching resistance includes polysilicon as a semiconductor material. An n-type impurity or a p-type impurity may be added to the quenching resistance.

For example, the insulating layer 30 includes first to fourth layers 31 to 34. The first to third layers 31 to 33 are located between the fourth layer 34 and the multiple light-receiving elements 10 in the Z-axis direction. The first layer 31 and the second layer 32 are located between the third layer 33 and the multiple light-receiving elements 10 in the Z-axis direction. The first layer 31 is located between the second layer 32 and the multiple light-receiving elements 10 in the Z-axis direction.

The contacts 64 and 66 are surrounded with the first layer 31, the second layer 32, and the third layer 33 along the X-Y plane. A portion of the first layer 31 is located between the quenching part 63 and the portion 15d of the fifth semiconductor region 15 in the Z-axis direction. The first wiring part 51 and the interconnect 65 are surrounded with the fourth layer 34.

Figure 12:
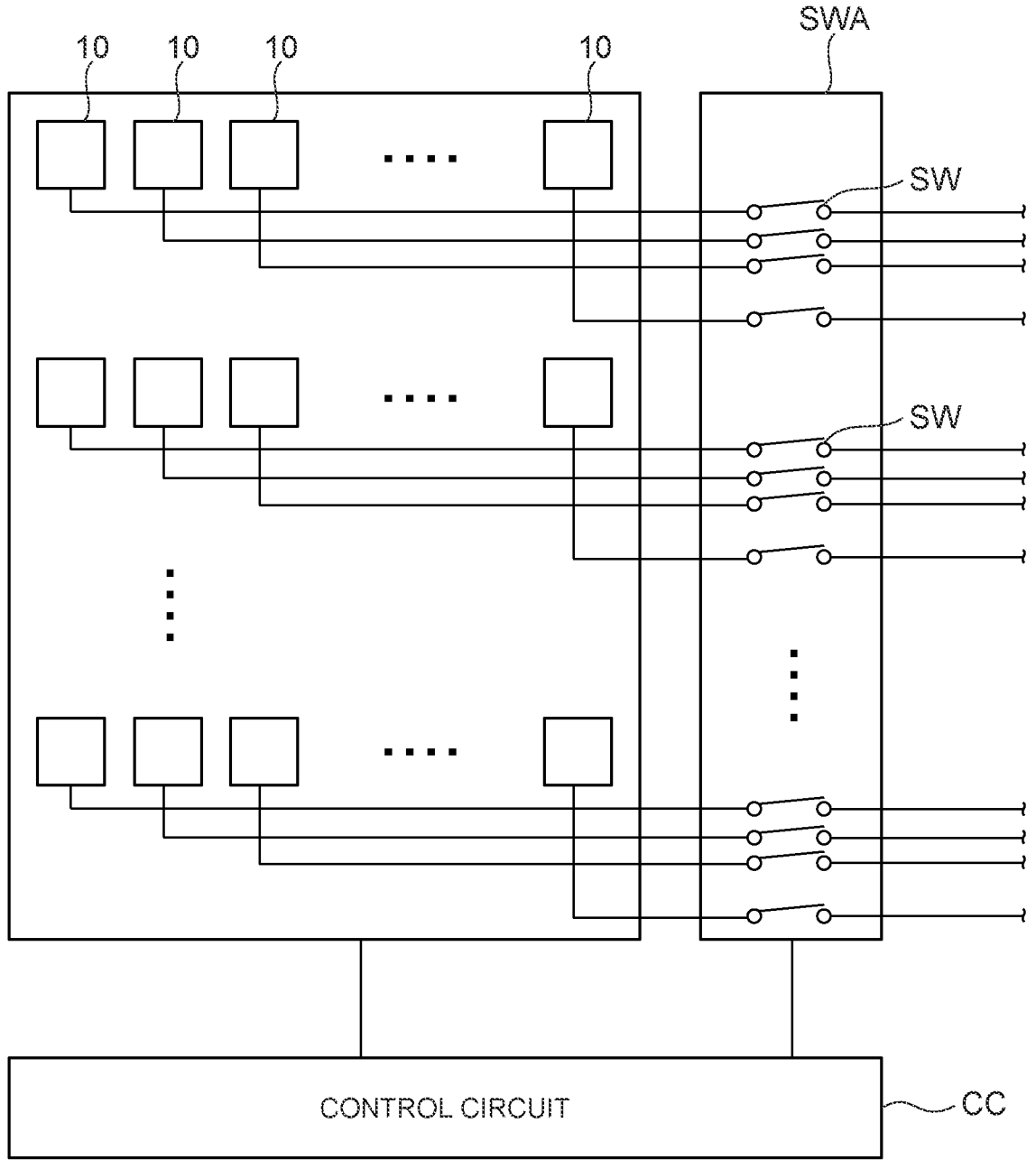
FIG. 12 is a schematic view illustrating an active quenching circuit.

FIG. 12 is a schematic view illustrating an active quenching circuit.

In the light detector according to the embodiments described above, a resistor that generates a large voltage drop is included as the quenching part 63. In the light detector according to embodiments, the control circuit and the switching element may be included instead of the resistor. In other words, an active quenching circuit for blocking the current is included as the quenching part 63.

As shown in FIG. 12, the active quenching circuit includes a control circuit CC and a switching array SWA. The control circuit CC includes a comparator, a control logic part, etc. The switching array SWA includes multiple switching elements SW. For example, at least a portion of the circuit elements included in the control circuit CC and the switching elements SW may be located on the semiconductor layer 22 or may be located on a circuit board other than the semiconductor layer 22.

As shown in FIG. 12, one switching element SW may be provided for one light-receiving element 10 (element region), or one switching element SW may be provided for multiple light-receiving elements 10. For example, one switching element SW is located between one first semiconductor region 11 and the first wiring part 51. Or, the switching element SW may be included in the first wiring part 51. For example, the switching element SW may be located between the first wiring part 51 and the pad 55.

Figure 13:
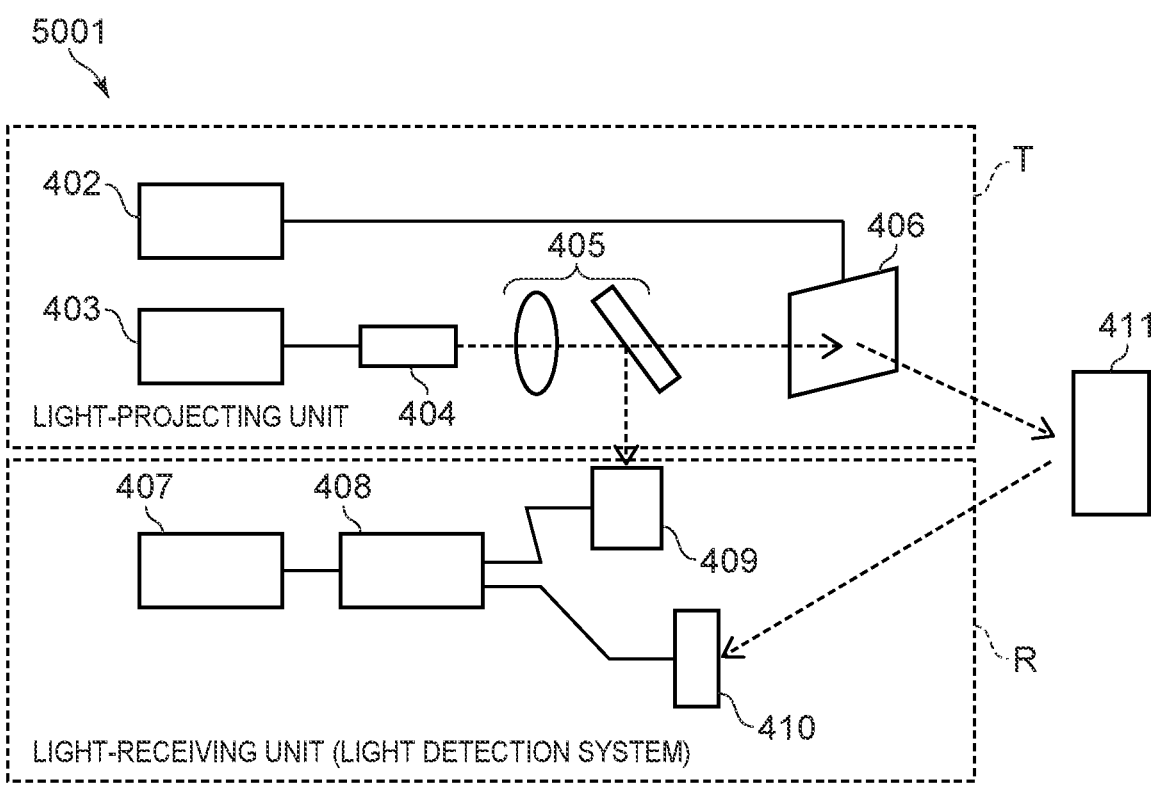
FIG. 13 is a schematic view illustrating a lidar (Laser Imaging Detection and Ranging (LIDAR)) device according to the embodiment.

FIG. 13 is a schematic view illustrating a lidar (Laser Imaging Detection and Ranging (LIDAR)) device according to the embodiment.

The embodiment is applicable to a long-distance subject detection system (LIDAR) or the like that includes a line light source and a lens. The lidar device 5001 includes a light-projecting unit T projecting laser light toward an object 411, and a light-receiving unit R (also called a light detection system) receiving the laser light from the object 411, measuring the time of the round trip of the laser light to and from the object 411, and converting the time into a distance.

In the light-projecting unit T, a light source 404 emits light. For example, the light source 404 includes a laser light oscillator and produces laser light. A drive circuit 403 drives the laser light oscillator. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light-receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the measurement results of the distance measuring circuit 408.

The lidar device 5001 employs light time-of-flight ranging (Time of Flight) in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band that is invisible to humans. For example, the lidar device 5001 can be used for obstacle detection for a mobile body.

Figure 14:
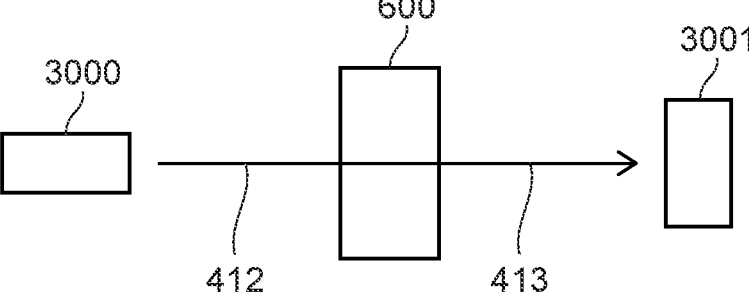
FIG. 14 describes the detection of the detection object of the lidar device.

FIG. 14 describes the detection of the detection object of the lidar device.

A light source 3000 emits light 412 toward an object 600 that is the detection object. A light detector 3001 detects light 413 that passes through the object 600, is reflected by the object 600, or is diffused by the object 600.

For example, the light detector 3001 can realize highly-sensitive detection when the light detector according to the embodiment described above is used. It is favorable to provide multiple sets of the light detector 410 and the light source 404 and to preset the arrangement relationship in the software (which is replaceable with a circuit). For example, it is favorable for the arrangement relationship of the sets of the light detector 410 and the light source 404 to have uniform spacing. Thereby, an accurate three-dimensional image can be generated by the output signals of each light detector 410 complementing each other.

Figure 15:
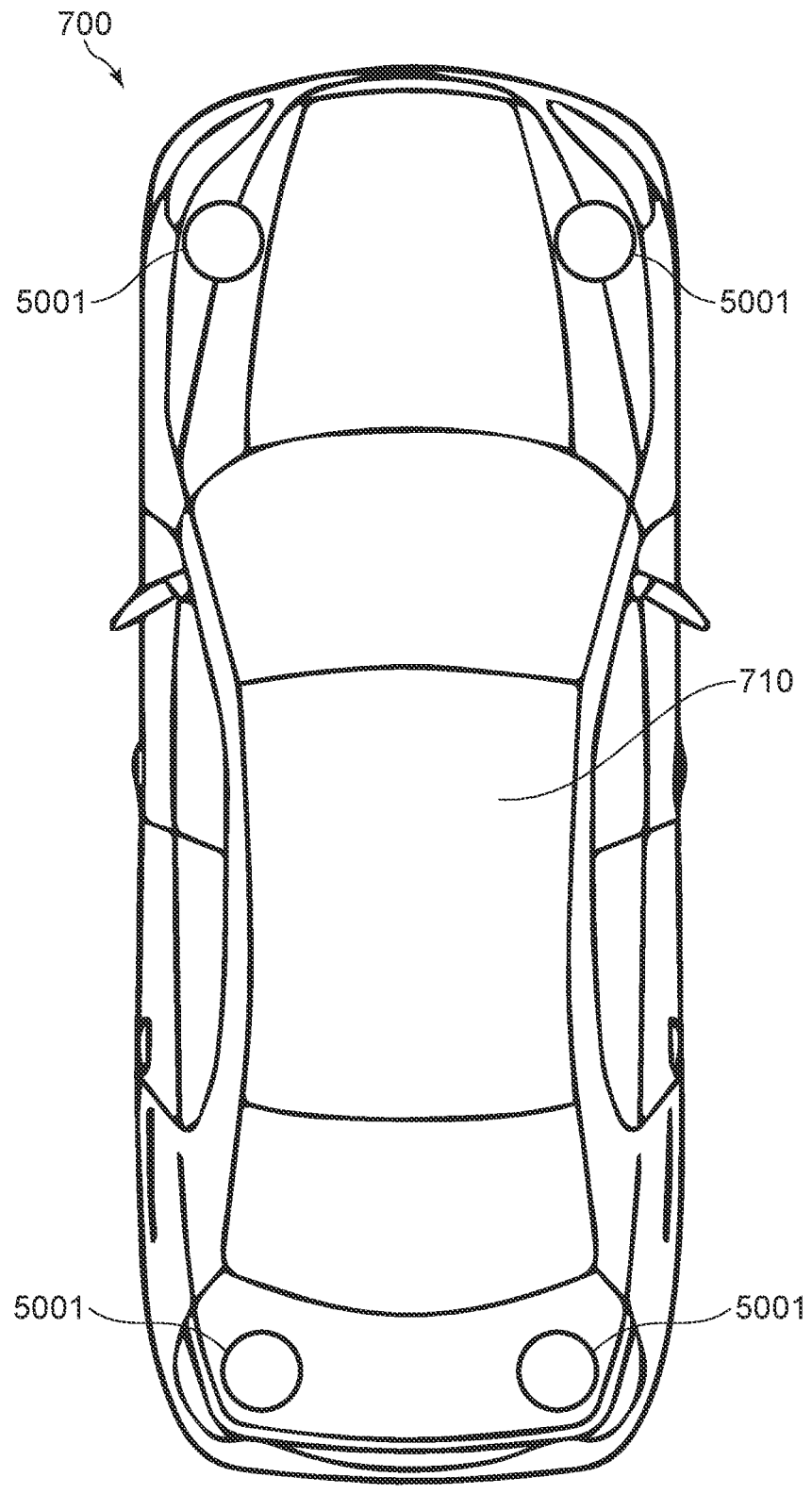
FIG. 15 is a schematic top view of a mobile body that includes the lidar device according to the embodiment.

FIG. 15 is a schematic top view of a mobile body that includes the lidar device according to the embodiment.

In the example of FIG. 15, the mobile body is a vehicle. The vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar device.

Other than the vehicle illustrated in FIG. 15, the mobile body may be a drone, a robot, etc. The robot is, for example, an automated guided vehicle (AGV). By including the lidar devices at the four corners of such mobile bodies, the environment in all directions of the mobile body can be detected by the lidar devices.

According to embodiments, a light detector, a light detection system, a lidar device, and a mobile body can be provided in which the responsivity can be improved.

In the specification of the application, "perpendicular" refers to not only strictly perpendicular but also include, for example, the fluctuation due to manufacturing processes, etc. It is sufficient to be substantially perpendicular.

In this specification, being "electrically connected" includes not only the case of being connected in direct contact, but also the case of being connected via another conductive member, etc.

Embodiments may include the following configurations.

Configuration 1

A light detector, comprising:
a semiconductor layer of a first conductivity type; and
a light-receiving element,
the light-receiving element including
a first semiconductor region of a second conductivity type,
a second semiconductor region located between the first semiconductor region and the semiconductor layer, the second semiconductor region being of the first conductivity type and contacting the first semiconductor region,
a third semiconductor region located between the second semiconductor region and the semiconductor layer, the third semiconductor region being of the second conductivity type, and
a fourth semiconductor region located between the third semiconductor region and the semiconductor layer, the fourth semiconductor region being of the first conductivity type and having a lower first-conductivity-type impurity concentration than a first-conductivity-type impurity concentration of the semiconductor layer.

Configuration 2

The detector according to Configuration 1, further comprising:
a structure part having a different refractive index from the light-receiving element,
the third semiconductor region being arranged with the structure part in a direction orthogonal to a first direction,
the first direction being from the semiconductor layer toward the light-receiving element.

Configuration 3

The detector according to Configuration 1 or 2, wherein
a first-conductivity-type impurity concentration at a boundary between the first semiconductor region and the second semiconductor region is greater than a first-conductivity-type impurity concentration at a boundary between the third semiconductor region and the fourth semiconductor region.

Configuration 4

The detector according to any one of Configurations 1 to 3, wherein
a maximum value of a second-conductivity-type impurity concentration in the third semiconductor region is less than a maximum value of a first-conductivity-type impurity concentration in the second semiconductor region.

Configuration 5

The detector according to any one of Configurations 1 to 4, wherein
the third semiconductor region contacts the fourth semiconductor region.

Configuration 6

The detector according to any one of Configurations 1 to 5, wherein
the light-receiving element further includes a fifth semiconductor region located between the second semiconductor region and the third semiconductor region,
the fifth semiconductor region is of the first conductivity type, and
a first-conductivity-type impurity concentration of the light-receiving element has a minimum in the fifth semiconductor region.

Configuration 7

The detector according to Configuration 6, wherein
a first-conductivity-type impurity concentration at a boundary between the third semiconductor region and the fourth semiconductor region is greater than a first-conductivity-type impurity concentration in the fifth semiconductor region.

Configuration 8

The detector according to any one of Configurations 1 to 5, wherein
the third semiconductor region contacts the second semiconductor region,
the third semiconductor regions contacts the fourth semiconductor region, and
a first-conductivity-type impurity concentration at a boundary between the third semiconductor region and the fourth semiconductor region is greater than a first-conductivity-type impurity concentration at a boundary between the third semiconductor region and the second semiconductor region.

Configuration 9

The detector according to any one of Configurations 1 to 4, wherein
the light-receiving element further includes a fifth semiconductor region located between the third semiconductor region and the fourth semiconductor region,
the fifth semiconductor region is of the first conductivity type, and
a first-conductivity-type impurity concentration of the light-receiving element has a minimum in the fifth semiconductor region.

Configuration 10

The detector according to any one of Configurations 1 to 9, wherein
a thickness of the third semiconductor region is less than a thickness of the second semiconductor region.

Configuration 11

The detector according to Configuration 6 or 7, wherein
a thickness of the fifth semiconductor region between the second semiconductor region and the third semiconductor region is greater than a thickness of the third semiconductor region.

Configuration 12

The detector according to any one of Configurations 1 to 11, wherein
a depletion layer is formed in a range including a boundary between the first semiconductor region and the second semiconductor region when the light-receiving element operates, and
an end portion of the depletion layer is positioned inside the fourth semiconductor region.

Configuration 13

The detector according to any one of Configurations 1 to 12, further comprising:
a resistor electrically connected with the light-receiving element, or a switching element electrically connected with the light-receiving element.

Configuration 14

The detector according to any one of Configurations 1 to 13, wherein
the light-receiving element is a p-i-n diode or an avalanche photodiode.

Configuration 15

The detector according to Configuration 14, wherein
the avalanche photodiode operates in a Geiger mode.

Configuration 16

A light detection system, comprising:

the detector according to any one of Configurations 1 to 15; and a distance measuring circuit calculating a time-of-flight of light based on an output signal of the detector.

Configuration 17

A lidar device, comprising:

a light source irradiating light on an object; and the light detection system according to Configuration 16, the light detection system detecting light reflected by the object.

Configuration 18

The device according to Configuration 17, further comprising:

an image recognition system generating a three-dimensional image based on an arrangement relationship of the light source and the detector.

Configuration 19

A mobile body, comprising:

the device according to Configuration 17 or 18.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light detectors such as semiconductor layers, light-receiving elements, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light detectors, light detection systems, lidar devices and mobile bodies practicable by an appropriate design modification by one skilled in the art based on the light detectors, the light detection systems, the lidar devices and the mobile bodies described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:

a semiconductor layer of a first conductivity type; and a light-receiving element, the light-receiving element including:

a first semiconductor region of a second conductivity type;

a second semiconductor region located between the first semiconductor region and the semiconductor layer, the second semiconductor region being of the first conductivity type and contacting the first semiconductor region;

a third semiconductor region located between the second semiconductor region and the semiconductor layer, the third semiconductor region being of the second conductivity type; and a fourth semiconductor region located between the third semiconductor region and the semiconductor layer, the fourth semiconductor region being of the first conductivity type and having a lower first-conductivity-type impurity concentration than a first-conductivity-type impurity concentration of the semiconductor layer, wherein in a plane perpendicular to a first direction, the third semiconductor region is located at a center of the light-receiving element, the first direction extending from the semiconductor layer toward the light-receiving element, wherein in the plane, a center position of the third semiconductor region matches at least one of a center position of the first semiconductor region and a center position of the second semiconductor region, and wherein during operation of the light-receiving element, a depletion layer continuously spreads from the first semiconductor region to the fourth semiconductor region.

2. The detector according to claim 1, further comprising:

a structure part having a different refractive index from the light-receiving element, wherein the third semiconductor region is arranged with the structure part in a direction orthogonal to the first direction.

3. The detector according to claim 1, wherein a first-conductivity-type impurity concentration at a boundary between the first semiconductor region and the second semiconductor region is greater than a first-conductivity-type impurity concentration at a boundary between the third semiconductor region and the fourth semiconductor region.

4. The detector according to claim 1, wherein a maximum value of a second-conductivity-type impurity concentration in the third semiconductor region is less than a maximum value of a first-conductivity-type impurity concentration in the second semiconductor region.

5. The detector according to claim 1, wherein the third semiconductor region contacts the fourth semiconductor region.

6. The detector according to claim 1, wherein a thickness of the third semiconductor region is less than a thickness of the second semiconductor region.

7. The detector according to claim 1, further comprising:

a resistor electrically connected to the light-receiving element, or a switching element electrically connected to the light-receiving element.

8. The detector according to claim 1, wherein the light-receiving element is a p-i-n diode or an avalanche photodiode.

9. The detector according to claim 8, wherein the light-receiving element is an avalanche photodiode, and the avalanche photodiode operates in a Geiger mode.

10. A light detection system, comprising:

the detector according to claim 1; and a distance measuring circuit calculating a time-of-flight of light based on an output signal of the detector.

11. A lidar device, comprising:

a light source irradiating light on an object; and the light detection system according to claim 10, the light detection system detecting light reflected by the object.

12. The device according to claim 11, further comprising:
an image recognition system generating a three-dimensional image based on an arrangement relationship of the light source and the detector.

13. A mobile body, comprising:
the device according to claim 11.

14. A light detector comprising:
a semiconductor layer of a first conductivity type; and
a light-receiving element, the light-receiving element including:
    a first semiconductor region of a second conductivity type;
    a second semiconductor region located between the first semiconductor region and the semiconductor layer, the second semiconductor region being of the first conductivity type and contacting the first semiconductor region;
    a third semiconductor region located between the second semiconductor region and the semiconductor layer, the third semiconductor region being of the second conductivity type;
    a fourth semiconductor region located between the third semiconductor region and the semiconductor layer, the fourth semiconductor region being of the first conductivity type and having a lower first-conductivity-type impurity concentration than a first-conductivity-type impurity concentration of the semiconductor layer; and
    a fifth semiconductor region located between the second semiconductor region and the third semiconductor region, the fifth semiconductor region being of the first conductivity type, wherein
a first-conductivity-type impurity concentration of the light-receiving element has a minimum in the fifth semiconductor region.

15. The detector according to claim 14, wherein a first-conductivity-type impurity concentration at a boundary between the third semiconductor region and the fourth semiconductor region is greater than a first-conductivity-type impurity concentration in the fifth semiconductor region.

16. The detector according to claim 14, wherein a thickness of the fifth semiconductor region between the second semiconductor region and the third semiconductor region is greater than a thickness of the third semiconductor region.

17. A light detector comprising:
a semiconductor layer of a first conductivity type; and
a light-receiving element, the light-receiving element including:
    a first semiconductor region of a second conductivity type;
    a second semiconductor region located between the first semiconductor region and the semiconductor layer, the second semiconductor region being of the first conductivity type and contacting the first semiconductor region;
    a third semiconductor region located between the second semiconductor region and the semiconductor layer, the third semiconductor region being of the second conductivity type and contacting the second semiconductor region; and
    a fourth semiconductor region located between the third semiconductor region and the semiconductor layer, the fourth semiconductor region being of the first conductivity type, having a lower first-conductivity-type impurity concentration than a first-conductivity-type impurity concentration of the semiconductor layer, and contacting the third semiconductor regions, wherein
a first-conductivity-type impurity concentration at a boundary between the third semiconductor region and the fourth semiconductor region is greater than a first-conductivity-type impurity concentration at a boundary between the third semiconductor region and the second semiconductor region.

18. A light detector comprising:
a semiconductor layer of a first conductivity type; and
a light-receiving element, the light-receiving element including:
    a first semiconductor region of a second conductivity type;
    a second semiconductor region located between the first semiconductor region and the semiconductor layer, the second semiconductor region being of the first conductivity type and contacting the first semiconductor region;
    a third semiconductor region located between the second semiconductor region and the semiconductor layer, the third semiconductor region being of the second conductivity type;
    a fourth semiconductor region located between the third semiconductor region and the semiconductor layer, the fourth semiconductor region being of the first conductivity type and having a lower first-conductivity-type impurity concentration than a first-conductivity-type impurity concentration of the semiconductor layer; and
    a fifth semiconductor region located between the third semiconductor region and the fourth semiconductor region, the fifth semiconductor region being of the first conductivity type, wherein
a first-conductivity-type impurity concentration of the light-receiving element has a minimum in the fifth semiconductor region.

19. A light detector comprising:
a semiconductor layer of a first conductivity type; and
a light-receiving element, the light-receiving element including:
    a first semiconductor region of a second conductivity type;
    a second semiconductor region located between the first semiconductor region and the semiconductor layer, the second semiconductor region being of the first conductivity type and contacting the first semiconductor region;
    a third semiconductor region located between the second semiconductor region and the semiconductor layer, the third semiconductor region being of the second conductivity type; and
    a fourth semiconductor region located between the third semiconductor region and the semiconductor layer, the fourth semiconductor region being of the first conductivity type and having a lower first-conductivity-type impurity concentration than a first-conductivity-type impurity concentration of the semiconductor layer,
wherein a depletion layer is formed in a range including a boundary between the first semiconductor region and the second semiconductor region when the light-receiving element operates, and
wherein an end portion of the depletion layer is positioned inside the fourth semiconductor region.

20. A light detector, comprising:

a semiconductor layer of a first conductivity type; and a light-receiving element, the light-receiving element including:

a first semiconductor region of a second conductivity type;

a second semiconductor region located between the first semiconductor region and the semiconductor layer, the second semiconductor region being of the first conductivity type and contacting the first semiconductor region;

a third semiconductor region located between the second semiconductor region and the semiconductor layer, the third semiconductor region being of the second conductivity type and contacting the second semiconductor region; and a fourth semiconductor region located between the third semiconductor region and the semiconductor layer, the fourth semiconductor region being of the first conductivity type and having a lower first-conductivity-type impurity concentration than a first-conductivity-type impurity concentration of the semiconductor layer, wherein a first-conductivity-type impurity concentration is greater at a boundary between the first and second semiconductor regions than a first-conductivity-type impurity concentration at a boundary between the third and fourth semiconductor regions, and wherein during operation of the light-receiving element, a depletion layer continuously spreads from the first semiconductor region to the fourth semiconductor region.

* * * * *